United States Patent
Kasukabe et al.

(10) Patent No.: US 7,285,430 B2
(45) Date of Patent: Oct. 23, 2007

(54) CONNECTION DEVICE AND TEST SYSTEM

(75) Inventors: Susumu Kasukabe, Yokohama (JP); Terutaka Mori, Urayasu (JP); Akihiko Ariga, Musashimurayama (JP); Hidetaka Shigi, Hakone-machi (JP); Takayoshi Watanabe, Fujisawa (JP); Ryuji Kono, Chiyoda-machi (JP)

(73) Assignee: Hitachi, Ltd., Tokyo (JP)

( * ) Notice: Subject to any disclaimer, the term of this patent is extended or adjusted under 35 U.S.C. 154(b) by 28 days.

(21) Appl. No.: 10/873,168

(22) Filed: Jun. 23, 2004

(65) Prior Publication Data
US 2004/0235207 A1  Nov. 25, 2004

Related U.S. Application Data

(63) Continuation of application No. 09/971,606, filed on Oct. 9, 2001, now Pat. No. 6,759,258, which is a continuation of application No. 09/423,385, filed on Nov. 8, 1999, now Pat. No. 6,305,230.

(30) Foreign Application Priority Data

May 9, 1997 (JP) ............................... P09-119107
Mar. 3, 1998 (JP) ............................... P10-049912

(51) Int. Cl.
*G01R 31/26* (2006.01)
(52) U.S. Cl. ........................ 438/17; 438/14; 438/15; 438/16; 438/18
(58) Field of Classification Search ............. 438/14–18
See application file for complete search history.

(56) References Cited

U.S. PATENT DOCUMENTS 4,747,784 A * 5/1988 Cedrone ....................... 439/71

(Continued)

FOREIGN PATENT DOCUMENTS

EP      A 0 544 305 A2   6/1993

(Continued)

OTHER PUBLICATIONS

Leslie et al., "Membrane Probe Card Technology" 1998 IEEE International Test Conference, Paper 30.1, pp. 601-607.

(Continued)

*Primary Examiner*—Carl Whitehead, Jr.
*Assistant Examiner*—Colleen E. Rodgers
(74) *Attorney, Agent, or Firm*—Antonelli, Terry, Stout & Kraus, LLP.

(57) ABSTRACT

To achieve high speed exchange of electrical signals between a connection device and a tester, a support member is provided for supporting the connection device, a plurality of pointed contact terminals are arrayed in an area on the probing side, a multiplayer film is provided having a plurality of lead out wires electrically connected to the contact terminals and a ground layer enclosing an insulation layer, and a frame is clamped on the rear side of the multiplayer film. A clamping member is provided on the frame to make the multiplayer film project out to eliminate slack in the multiplayer film. A contact pressure means is provided for making the tips of the contact terminals contact each of the electrodes with predetermined contact pressure from the support member to the clamping member. A compliance mechanism is provided so that the contact terminal group of the tip surface is arrayed in parallel with the electrode group terminal surface, so that the tips of the contact terminals contact the surface of the electrodes with an equal pressure.

8 Claims, 18 Drawing Sheets

U.S. PATENT DOCUMENTS

| | | |
|---|---|---|
| 5,055,778 A | 10/1991 | Okubo et al. |
| 5,532,906 A | 7/1996 | Hanari et al. |
| 5,672,977 A | 9/1997 | Yamada |
| 5,945,834 A | 8/1999 | Nakata et al. |

FOREIGN PATENT DOCUMENTS

| | | |
|---|---|---|
| EP | A 0 544 305 A3 | 6/1993 |
| JP | 4743029 | 10/1972 |
| JP | 60260861 A | 12/1985 |
| JP | 2049385 | 2/1990 |
| JP | 2126160 | 5/1990 |
| JP | 2-163664 | 6/1990 |
| JP | 4297050 | 10/1992 |
| JP | 5-29406 | 2/1993 |
| JP | 5-243344 | 9/1993 |
| JP | 5226430 | 9/1993 |
| JP | 6291239 | 10/1994 |
| JP | 7037935 | 2/1995 |
| JP | 7-283280 | 10/1995 |
| JP | 07-283280 | * 10/1995 |
| JP | 7-288271 | 10/1995 |
| JP | 7283280 | 10/1995 |
| JP | 07283280 A | 10/1995 |
| JP | 8-083824 | 3/1996 |
| JP | 08083824 | 3/1996 |
| JP | 8-220138 | 8/1996 |
| JP | 8220140 | 8/1996 |
| JP | 8316641 | 11/1996 |
| JP | 410308423 A | * 11/1998 |
| WO | WO9607924 | 3/1996 |

OTHER PUBLICATIONS

Abstract of JP 08083824 A, 1996.
Abstract of JP 05226430 A, 1992.
Abstract of JP 03120474 A, 1991.
Abstract of JP 08005666 A, 1996.

* cited by examiner (a)

(b)

CONNECTION DEVICE AND TEST SYSTEM

This application is a Continuation application of U.S. application Ser. No. 09/971,606, filed Oct. 9, 2001 (now U.S. Pat. No. 6,759,258), which is a Continuation application of U.S. application Ser. No. 09/423,385, filed Nov. 8, 1999 (now U.S. Pat. No. 6,305,230), the entire disclosure of which is hereby incorporated by reference. U.S. application Ser. No. 09/423,385, filed Nov. 8, 1999 (now U.S. Pat. No. 6,305,230) is a Section 371 of International Application No. PCT/JP98/01722, filed May 14, 1998.

TECHNICAL FIELD

This invention relates to a connection device and test system for sending an electrical signal to electrodes through contact terminals in contact with matching electrodes and implementing testing, such as pass/fail tests of items for inspection, such as semiconductor devices. The invention relates in particular to a connection device and test system to prevent harm or wear to the items under test, such as semiconductor devices having numerous pin type electrodes disposed at a narrow pitch.

BACKGROUND OF THE INVENTION

A method is known for testing electrical characteristics of semiconductor devices, such as VLSI devices, at the wafer level with a conventional thin-type probe card, as disclosed in the lecture archives of the 1988 Annual International Test Conference on Membrane Probe Card Technology, from pages 601 to 607 (hereafter Publication 1). In this conductive test probe as described in Publication 1, wiring was formed by lithography on a flexible dielectric film, and a semi-spherical bump, formed by plating in a through-hole of dielectric film formed at a position matching the electrodes of the semiconductor device-for testing, was utilized as the contact terminal. In the test method described in this publication 1, the bump, which is connected to the testing circuit by way of the wiring substrate and wiring formed on the surface of the dielectric film, was caused to rub against the electrode of the semiconductor device under test to make contact by a spring effect, and testing was then implemented by an exchange of electrical signals.

Other known methods are described Japanese Laid-Open Patent 2-163664 (hereafter Publication 2), Japanese Laid-Open Patent 5-243344 (hereafter Publication 3), Japanese Laid-Open Patent 8-83824 (hereafter Publication 4), Japanese Laid-Open Patent 8-220138 (hereafter Publication 5), and Japanese Laid-Open Patent 7-283280 (hereafter Publication 6).

In Publication 1 as well as Publications 2, 3, 4 and 5, a testing method is disclosed using a probe device with an automatic offset function having a conveyor means (structure with a lower conductive stage to receive an upper conductive stage installed on a pivot) to make spring contact with a support means to basically form a joint level surface between the flat membrane probe and an essentially flat device under test.

Further, a method is disclosed in the Publications 2, 3,4 and 5 which proposes to install a cushioning material between the lower conductive stage and the membrane.

Also, in the Publication 5, a method is disclosed for use of a micro-strip line achieved by low-impedance and impedance matching by installing and grounding a metallic conductive layer on the reverse side of a thin conductive pattern formed on a metal protuberance.

Also, in the Publication 6, a method is disclosed for use of a probing device wherein a contact terminal shaped with a point at the tip, obtained by etching a crystalline mold material of anisotropic shape, is connectably embedded in a lead out wiring formed from an insulator film, and this insulator film encloses the silicon wafer forming the substrate and cushioning layer forming a single unit with respect to the wiring substrate.

As described in the above Publication 1, the contact point (protuberance on the electrode) of the probe formed from a flat or semi-spherical bump makes a friction contact, rubbing away the oxidation on the material of the device under test created by a rubbing contact (scribing action) from the aluminum electrode or solder electrode of the probe contact point, and the oxidation is also rubbed away from the electrode material surface to make contact with the conductive metal material at the lower surface. As a result, the scribing action of the electrode at the contact point creates debris from the electrode material causing electrical shorts between the wiring or wiring layers or creating foreign matter. The electrode in many cases is subjected to further damage and wear by the scribing (rubbing) action of the probe which applies a weight of several hundred mN to assure contact with the electrode.

The methods of Publication 2 through Publication 5 have a function for allowing the contact point group to make contact in parallel with the surface of the electrodes of the device under test; however, this structure applies a contact load by displacement of a plate spring so that the spring plate is greatly displaced in terms of a uniform load, making application of a load of several hundred mN per pin necessary when making contact-Consequently, this load creates the problem of damage and wear on the electrodes of the device under test as well as on the active device and wiring directly beneath those electrodes and related problems occurring due to this damage and wear.

In the method of Publication 6, a problem occurs in that absorbing height differences in the contact terminal and electrodes of the device under test, or absorbing the impact received by the contact terminals from driving the material mount holding the device under test during probing, just by means of the cushioning layer is difficult and may also create possible wear and tear on the device under test such as a semiconductor device.

Therefore, none of the known techniques as described above, allows for low load, stable probing of devices under test, such as semiconductor elements having many pins disposed at a narrow pitch caused by high density, without causing damage or wear.

SUMMARY OF THE INVENTION

This invention has the object of providing a connection device and test system that eliminates the problems of the prior art and is capable of low load, stable probing of devices under test having numerous pins with A narrow pitch and high density, such as semiconductor elements, without causing damage, and is further capable of sending high speed electrical signals namely high frequency electrical signals.

This invention has the further object of providing a connection device and test system that applies a light load using only downward pressure from the pointed tip of the contact terminal onto the electrodes of the device under test without generating debris, such as from the electrode material, thereby to achieve a stable connection with low resistance.

This invention has the still further object of providing a connection device and test system wherein a contact terminal having a pointed tip and the lead wiring are formed separately, and both are connected to form a contact wire with lead wiring so that the yield during manufacture is improved, the manufacturing time is shortened and the cost is decreased.

In order to achieve the above mentioned objects, the connection device of this invention for making electrical contact with array of electrodes of devices under test, such as semiconductor elements, and for performing an exchange of electrical signals is characterized by having a support member for supporting the connection device, a plurality of pointed contact terminals arrayed on the probing side, a multilayer film having a plurality of lead out wires electrically connected to the periphery of the contact terminals and a ground layer enclosing an insulation layer facing the plurality of lead out wires, a clamping member installed on the multilayer film to eliminate slack or drooping in the applicable area and a contact pressure means such as a spring probe for making the tip of each of the contact terminals contact each of the electrodes by applying contact pressure from the support member to the clamping member.

Also, in order to achieve the above mentioned objects, the connection device of this invention for making electrical contact with an array of electrodes of devices under test, such as semiconductor elements, and for performing an exchange of electrical signals is characterized by having a support member for supporting the connection device, a plurality of pointed contact terminals arrayed on the probing side, a multilayer film having a plurality of lead out wires electrically connected to the periphery of the contact terminals and a ground layer enclosing an insulation layer facing the plurality of lead out wires, a clamping member installed on the multilayer film to eliminate slack or drooping in the applicable area, a contact pressure means such as a spring probe for making the tip of each of the contact terminals contact each of the electrodes by applying contact pressure from the support member to the clamping member, and a compliance mechanism to make the support member engage with the clamping member so that the tips of the contact terminal group are arrayed in parallel with the electrode group terminal surface, when making the tips of the contact terminals contact the surface of the electrodes.

Further, in order to achieve the above mentioned objects, the connection device of this invention for making electrical contact with an array of electrodes of devices under test, such as semiconductor elements, and for performing an exchange of electrical signals is characterized by having a support member for supporting the connection device, a plurality of pointed contact terminals arrayed in an area on the probing side, a multilayer film having a plurality of lead out wires electrically connected to the periphery of the contact terminals and a ground layer enclosing an insulation layer facing the plurality of lead out wiring, a frame clamped so as to enclose the applicable area on the probing side and the rear of the opposite side on the multilayer film, a clamping member to install the frame having a portion to make the applicable area project out to eliminate slack in the multilayer film, a contact pressure means such as a spring probe for making the tip of each of the contact terminals contact each of the electrodes by applying contact pressure from the support member to the clamping member, and a compliance mechanism to make the support member engage with the clamping member so that the tips of the contact terminals are arrayed in parallel with the electrode group terminal surface, when making the tips of the contact terminals contact the surface of the electrodes.

Also, the connection device of this invention is characterized in that a cushioning device is installed between the clamping member and the rear sides of the area of the multilayer film.

The connection device of this invention has a multilayer film characterized in that the lead out wiring and the contact terminals are connected by metal such as solder or heat expansion metal or a conductive sheet of anisotropic shape.

The connection device of this invention has a multilayer film characterized in that the lead out wiring and the connective wiring formed in the contact terminals are connected by metal such as solder or heat expansion metal or a conductive sheet of anisotropic shape.

The connection device of this invention is characterized by having a circuit board mounted on the probing side of the support member, and the electrodes formed on the circuit board are electrically connected with the lead out wiring on the periphery of the multilayer film.

The test system of this invention is characterized by a connection device having a support means for a material support system to mount and support the device under test, a plurality of pointed contact terminals arrayed in an area on the probing side, a multilayer film having a plurality of lead out wires electrically connected to the contact terminals and a ground layer enclosing an insulation layer facing said plurality of lead out wires, a clamping member installed on said multilayer film so as to eliminate slack in the applicable area of the multifilm layer, a contact pressure means for making the tips of the contact terminals contact each of the electrodes by applying contact pressure from the support member to the clamping member, and further characterized by having a tester electrically connected to the lead out wires connecting to the periphery of the multilayer film of the connection device, a positioning means to align the positions of the contact terminal group arrayed in the multilayer film of the connection device and an electrode group arrayed on the device under test, and the position aligned electrode group is made to contact the contact terminal group aligned by the positioning means and exchange electrical signals between the tester and the device under test to perform testing.

The test system of this invention is also characterized by a connection device having a support means for a material support system to mount and support the device under test, a plurality of pointed contact terminals arrayed in an area on the probing side and electrically connected to the lead out wires of the multilayer film by metal such as solder or heat expansion metal or a conductive sheet of anisotropic shape, and a multilayer film having a plurality of lead out wires electrically connected at the periphery to these contact terminals by way of metal such as solder or heat expansion metal or a conductive sheet of anisotropic shape and having a ground layer enclosing an insulation layer facing said plurality of lead out wires, a clamping member to install said multilayer film so as to eliminate slack in the applicable area of the multilayer film, and a contact pressure means for making the tips of the contact terminals contact each of the electrodes by applying contact pressure from the support member to the clamping member, and further characterized by having a tester electrically connected to the lead out wires connecting to the periphery of the multilayer film of the connection device, a positioning means to align the positions of the contact terminal group arrayed in the multilayer film of the connection device and an electrode group arrayed on the device under test, and the position aligned electrode group is made to contact the contact terminal group aligned by the positioning means and exchange electrical signals between the tester and the device under test to perform testing.

The test system of this invention is also characterized by a connection device having a support means for a material support system to mount and support the device under test, a plurality of pointed contact terminals arrayed in an area on the probing side and electrically connected to the lead out wiring of the multilayer film, and a multilayer film having a plurality of lead out wires electrically connected at the periphery to these contact terminals and having a ground layer enclosing an insulation layer facing said plurality of lead out wires, a clamping member to install said multilayer film so as to eliminate slack in the applicable area of the multifilm layer, and a contact pressure means for making the tips of the contact terminals contact each of the electrodes by applying contact pressure from the support member to the clamping member, and further characterized by having a tester electrically connected to the lead out wires connecting to the periphery of the multilayer film of the connection device, a positioning means to align the positions of the contact terminal group arrayed in the multilayer film of the connection device and an electrode group arrayed on the device under test, and the position aligned electrode group is made to contact the contact terminal group raised to a desired height on the material support system by the positioning means and exchange electrical signals between the tester and the device under test to perform testing.

Therefore, in the structure of the invention as described above, stable, low load probing of many pins disposed at a narrow pitch on a semiconductor device with a high electrode density can be performed without damage to the device under test, and, furthermore, a high speed exchange of electrical signals or in other words high frequency electrical signals (high frequencies from about 100 MHz up to some 10 GHz) can be achieved.

Also, in the above described structure of this invention, the compliance mechanism achieves a parallel array of pointed contact terminals without slack in the applicable area of the multilayer film so that the pointed contact terminal group makes stable contact with the electrode group of the device under test, and so that a downward pressure with a low load on each pin (approximately 3 to 50 mN) achieves a stable connection with a low resistance of about 0.05 to 0.1 Ω and without generating debris from the electrode material, etc.

Further, in the above described structure of this invention, one or a plurality of semiconductor devices from among a plurality of semiconductor devices (chips) arrayed on a wafer can simultaneously be stably and reliably contacted at a small contact pressure (about 3 to 50 mN per pin) on the oxidized surface of the electrodes, formed for instance of aluminum or solder with a stable and low resistance value of 0.05 to 0.1 Ω, and operational tests of each semiconductor device can be performed by the tester. In other words, the above structure of this invention can handle devices with a high electrode density as well as a narrow pitch, and they further can perform testing by simultaneous probing of many discrete chips and can also perform operational tests with high speed electrical signals (high frequencies from about 100 MHz up to some 10 GHz).

Also, in the structure of this invention, forming the contact terminal and the lead out wire separately from each other and then connecting both to form a lead out wire with the contact terminal improves the productivity during manufacture and achieves a connection device and test system with a shorter manufacturing time and a low price.

BEST MODE FOR CARRYING OUT THE INVENTION

Various embodiments of the connection device and test system of this invention will be described with reference to the accompanying drawings.

Figure 1:
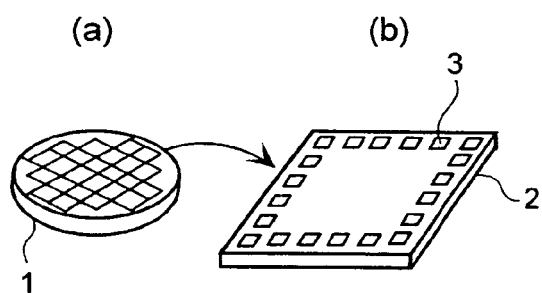
FIG. 1(a) is a perspective view showing the wafer as the item under test arrayed with semiconductor devices (chips).
FIG. 1(b) is an enlarged, perspective view showing one semiconductor device (chip).

An LSI semiconductor device (chip) 2, representing the device under test, is formed in large numbers on a wafer 1 shown in FIG. 1 and later is detached for use. FIG. 1(a) is a perspective view showing the wafer 1 formed with many LSI semiconductor devices (chips). FIG. 1(b) is a perspective view showing one enlarged semiconductor device (chip). The surface of the semiconductor device (chip) 2 is arrayed with a plurality of electrodes 3 along the periphery.

However, along with high integration of the semiconductor device, the electrodes 3 are placed at an ever greater density and narrower pitch. The pitch of the electrodes is within 0.2 mm and for instance may be 0.13 mm, 0.1 mm or less. In terms of high density of electrode placement, the electrodes may be from one row to two rows and are even showing a trend to be arrayed over the entire surface.

In the connection device (probing device) of this invention, one or a plurality of semiconductor devices from among a plurality of semiconductor devices (chips) arrayed on a wafer can simultaneously be stably and reliably contacted with a small contact pressure (about 3 to 50 mN per pin) on the oxidized surface of the electrodes, formed for instance of aluminum or solder with a stable and low resistance value of 0.05 to 0.1 Ω, and operational tests of each semiconductor device can be performed by the tester. In other words, the connection device (probing device) of this invention can handle devices with a high electrode density as well as a narrow pitch, and further can perform testing by simultaneous probing of many discrete chips and can also perform operational tests with high speed electrical signals (high frequencies from about 100 up to some 10 GHz)

Figure 2:
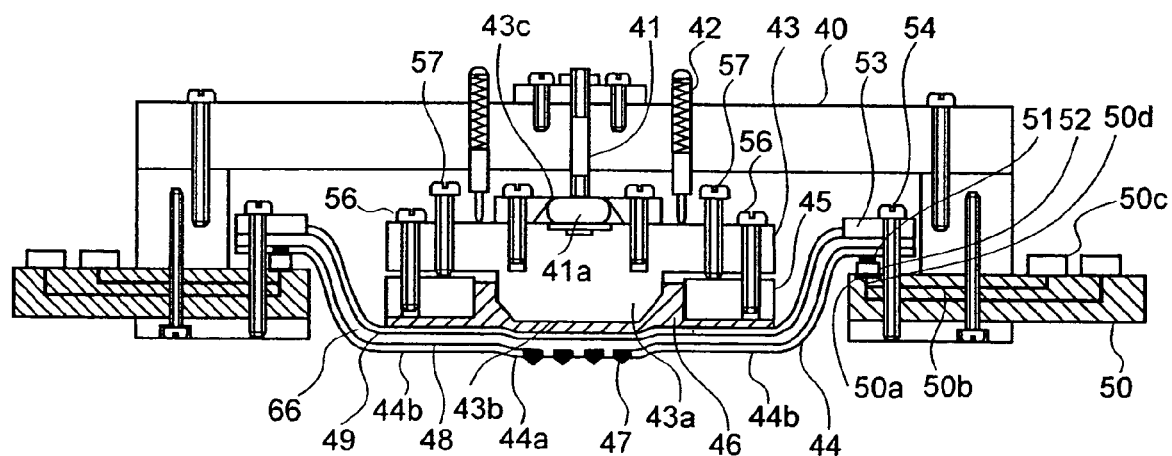
FIG. 2 is a cross sectional view showing an essential portion of the first embodiment of the connection device of this invention.

FIG. 2 is a cross sectional view showing an essential portion of the first embodiment of the connection device of this invention. In the first embodiment of this connection device, a center pivot 41 forms a support axis having a support member (upper clamp plate) 40, and a spherical member 41a, which is secured to the lower part of center pivot 41 and is installed for symmetrical movement back and forth and right and left, is centered on the center pivot 41. The connection device also has spring probes 42 as the pressure application means for applying a constant and fixed pressing force for upper and lower displacement, a pressing member (press plate) 43, which is subjected to a low load pressing force (about 3 to 50 mN per pin) by way of the spring probes 42, while maintaining a tiltable force by means of the taper (tilted) 43c relative to the center pivot 41. The connection device further has a multilayer film 44, a frame 45 clamped to the multilayer film 44, a cushioning layer 46 installed between the multilayer film 44 and the clamping member 43, a contact terminal 47 installed in the multilayer film 44, a lead out wire 48 connected to the contact terminal 47 installed in the multilayer film 44, and a ground layer 49 installed in the multilayer film 44. The structure for applying a pressing force on the pressing member 43 with the spring probes 42 is designed to obtain a constant low load pressing force from displacement of the tip of the spring probes 42, and use of the spring probe 42 is not always necessary. The support means (upper clamp plate) 40 is housed in a circuit board 50. The periphery of the multilayer film 44 is formed to extend to the outer side from the frame 45, and this extension bends smoothly under the outer side of the frame 45 and fastens on the circuit board 50. In this case, the lead out wire 48 is electrically connected to an electrode 50a installed in the circuit board 50. In order to make this connection to the electrode 50a of the circuit board 50, a fillet 51 filled with metallic plating is installed in the multilayer film 44 and the fillet 51 and electrode 50a can be made to directly contact each other, or they can be connected with an anisotropic conductive sheet 52 or solder, etc.

The circuit board 50 may be formed of plastic such as polyimide resin or glass-epoxy resin and contains the internal wiring 50b and the contact terminals 50c. The electrode 50a may for instance be connected to a portion of the internal wiring 50b by the fillet 50d. The circuit board 50 and the multilayer film 44 may for instance be fastened by enclosing the multilayer film 44 between the multilayer film clamp member 53 and the circuit board 50 and securing them with a screw 54.

The multilayer film 44 is flammable and preferably is formed with a heat resistant resin as the main constituent. In this embodiment, polyimide resin is utilized. The cushioning layer 46 is formed of a material having elasticity such as an elastomer (polymer material having resilience similar to rubber). More specifically, silicon rubber or an equivalent is used. A structure to supply gas to a movable sealed space may be used for the frame 45 with respect to the clamping member 43.

Also, if the evenness of the tip height of the contact terminal 47 can be maintained then the cushioning layer 46 can be omitted.

The contact terminal 47, the lead out wire 48 and the ground layer 49 are formed of conductive materials. Detailed information on the material will be subsequently provided. In order to simplify the explanation, only two contact terminals are shown in FIG. 2 for the lead out wire 48 and contact terminal 47; however, in actual use, a plurality of lead out wires 48 and contact terminals 47 are used as will be described later on.

First of all, in the connection device (probing devices of this invention, one or a plurality of semiconductor devices from among a plurality of semiconductor devices (chips) arrayed on a wafer are simultaneously yet stably and reliably contacted at a low contact pressure (about 3 to 50 mN per pin) on the oxidized surface of the electrodes, formed for instance of aluminum or solder with a stable and low resistance value of 0.05 to 0.1 Ω. Thus no scribing action is needed as required in the conventional art and the generation of debris from the scribing action on the electrode material can be prevented. In other words, along with arranging the array of pointed contact terminals 47 to match the array of electrodes 3, at the area 44a with the array of contact terminals 47 within the periphery 44b supported at the frame 45, the protuberance 43a formed on the lower side of clamping member 43 functions to stretch the multilayer film 44 enclosing the cushioning layer 46 to maintain a precise level in parallel with the lower surface 43b eliminating slack in the multilayer film 44 itself, and the pointed tip of the contact terminals 47 arrayed in the projected area 44a perform low load probing parallel to the electrode 3 (material being contacted) such as aluminum or solder, and the pointed contact terminal 47 easily breaks through the oxidation on the surface of the electrode 3 (material being contacted) and makes secure contact with the lower conductive metal material at a stable resistance value of 0.05 to 0.1 Ω. In particular, at the periphery 44b supported at the frame 45, the slack in the multilayer film itself is eliminated by the protuberance enclosing the cushioning layer 46 parallel with the lower surface 43b maintained at a precise level by the protuberance 43a formed in the lower side of the clamping member 43. The amount of projection in the area 44a, is determined by an adjusting screw 57 which adjusts the amount of protrusion from the lower surface of the clamping member 43 (press plate) by tightening left and right, back and forth centering on the center pivot 41. In other words, until the lower edge of the screws 57 for determining the protrusion amount makes contact with the upper surface of frame 45, the screw 56 inserted in the hole formed in the clamping member per front and back and left and right centering on the center pivot 41 is tightened in the frame 45 so that the protuberance 43a of the clamping member 43 is made to lower and by way of cushioning layer 46, the area 44a arrayed with a plurality of contact terminals 47 is caused to protrude to eliminate slack in the multilayer film 44. In this way, the flatness or level of the plurality of pointed contact terminals 47 can be maintained with a highly precise ±2 μm.

Figure 3:
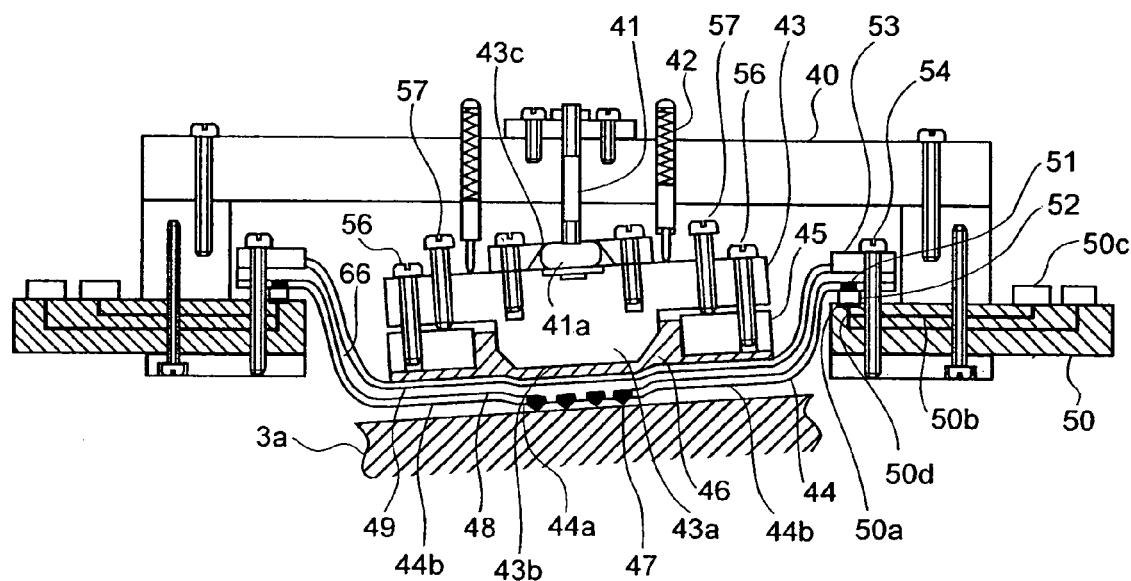
FIG. 3 is a cross sectional view showing the pointed contact terminals arrayed in the multilayer film in contact with the electrode surfaces of the device under test in the first embodiment of the connection device shown in FIG. 2.

Also, as shown in slightly exaggerated form in FIG. 3, in making the surfaces 3a of the electrode 3 (material being contacted) of the single or plurality of semiconductor devices disposed in parallel with the corresponding plurality of contact terminals 47, along with maintaining the clamping member (press plate) 43 in a tiltable state by means of the center pivot 41, a constant, fixed pressing force is applied by the spring probe 42, centering on the center pivot 41 installed symmetrically versus front and back and right and left movement in response to vertical displacement of the clamping member 43. In other words, a compliance mechanism for applying a low load per each pin is formed by engagement of the center pivot 41 (clamping member support axis) and clamping member 43 as well as the symmetrically installed spring probe 42. The follow up and paralleling of the plurality of points of the contact pins 47 with one or a plurality of surfaces 3a of the electrode 3 is performed by this compliance mechanism. As shown in FIG. 2, the center pivot 41 is positioned in the center of the clamping member 43, and by utilizing the tiltable contact state of the taper (tilt) 43c installed above the clamping member 43 and the lower spherical surface 41a of the center pivot, in the initial state, an initial specified position can be set by means of the pressing force of the spring probe 42. Next, a compliance mechanism has been formed by the center pivot 41 (clamping member support axis) and clamping member 43 as well as the spring probe 42 so that, as shown in FIG. 3, at the time when the pointed tips of contact terminals 47 start to contact the electrodes 3, the taper (tilt) 43c of the clamping member 43 rubs against a portion of the lower spherical surface 41a of the center pivot with the axis of the center pivot 41 serving as the central axis. The lower spherical surface 41a of the center pivot then separates from the taper (tilt) 43c of the clamping member 43, and the clamping member 43 then tilts so as to follow up on (trace) the overall surface 3a of the electrode 3, and along with making the surface with the plurality of pointed contact terminals parallel with the overall surface 3a of the electrode 3, variations greater than ±2 μm in the height of the individual contact terminal points are absorbed by localized warping of the cushioning layer 46, and contact with the electrode (material) 3 arrayed on the semiconductor wafer 1, with height variations maintained within ±0.5 μm, and uniform, low load, probing (about 3 to 50 mN per pin) can be achieved.

Therefore, as described above, by forming a projection in the multilayer film 44 by way of the cushioning layer 46 by means of a protuberance 43a of clamping member 43 for the area 44 arrayed with contact terminals 47 for the multilayer film 44, and by making the surface with the plurality of pointed contact terminals 47 parallel with the overall surface 3a of the electrode 3, by means of the tiltable support of the clamping member 43 in the center pivot 41, a uniform, low load, probing (about 3 to 50 mN per pin) of a plurality of separate chips can simultaneously be performed with a stable low resistance value of 0.05 to 0.1 Ω. Of course, the same kind of probing can also be achieved on one chip.

Figure 4:
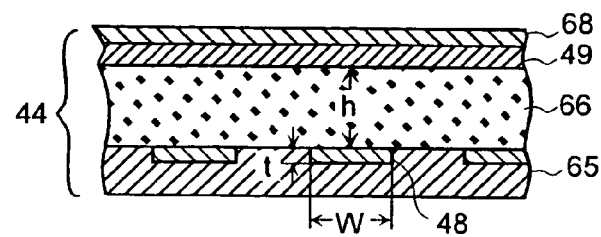
FIG. 4 is a cross sectional view showing a portion of the multilayer film with the insulator layer enclosed from opposite directions by the lead out wire and ground layer.

Also, by installing a ground layer 49 opposite and enclosing the insulation film 66 (74) for the lead out wiring 48 connected to each of the terminals 47 as shown in FIG. 4, appropriate values can be set for the conductivity $\epsilon_r$ of the insulation film 66 (74), the thickness (gap between the lead out wire 48 and the ground layer 49) h and also the width w of the lead out wire 48, and by setting the impedance ZO of the lead out wire 48 to about 50 Ω, impedance matching with the tester circuit can be achieved. Consequently, distortion and attenuation in the electrical signals sent via the lead out wire 48 can be prevented, and high frequency electrical signals (high frequencies from about 100 MHz up to some 10 GHz) can be utilized with the tester and semiconductor device under test to perform testing of the device electrical characteristics.

As described above, in the multilayer film 44 the impedance of the ground layer 49 that encloses the insulation film 66 (74) for the lead out wiring 48 connected to each of the terminals 47 can be matched with the impedance of the tester circuit at about 50 Ω. The length of other probes (contact terminals) will only be a contact terminal portion (0.05 to 0.5 mm) 47 so that impedance matching with the tester circuit is possible, distortion in the high speed electrical signals can be reduced and testing of electrical characteristics of the semiconductor device under test can be performed with high speed electrical signals.

Figure 5:
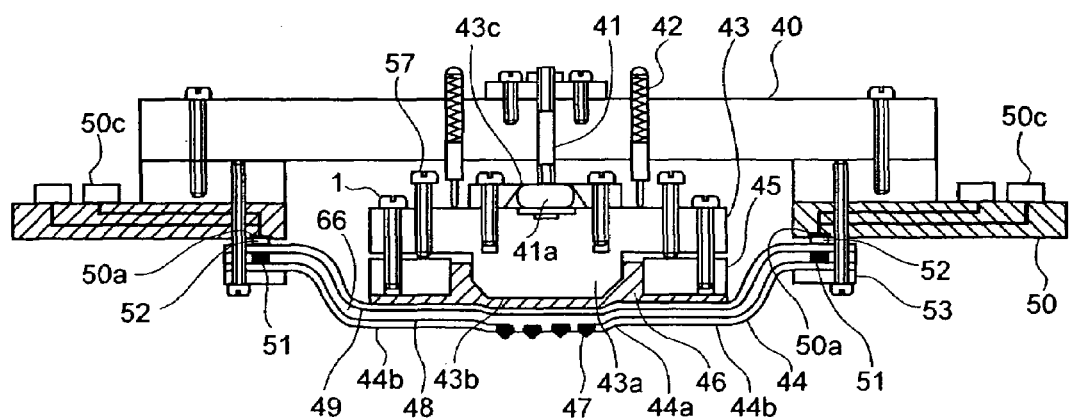
FIG. 5 is a cross sectional view showing an essential portion of the second embodiment of the connection device of this invention.

FIG. 5 shows an essential portion of the second embodiment of the connection device of this invention. In this second embodiment of the connection device, a fillet 51 filled with metallic plating at the upper edge of the lead out wiring 48 positioned below the circuit board 50 at the boundary of the multilayer film 44 may make direct contact with electrode 50a formed on the lower side of the circuit board 50 or may be connected by an anisotropic conductive sheet 52 or by solder, etc. In other words, in the second embodiment of this invention, an upper edge can be formed at the edge of the lead out wire 48 for the multilayer film 44 by means of the fillet 51, and connected with the electrode 50a installed at the bottom of the circuit board 50. All other structures are identical to the first embodiment shown in FIG. 2.

Figure 6:
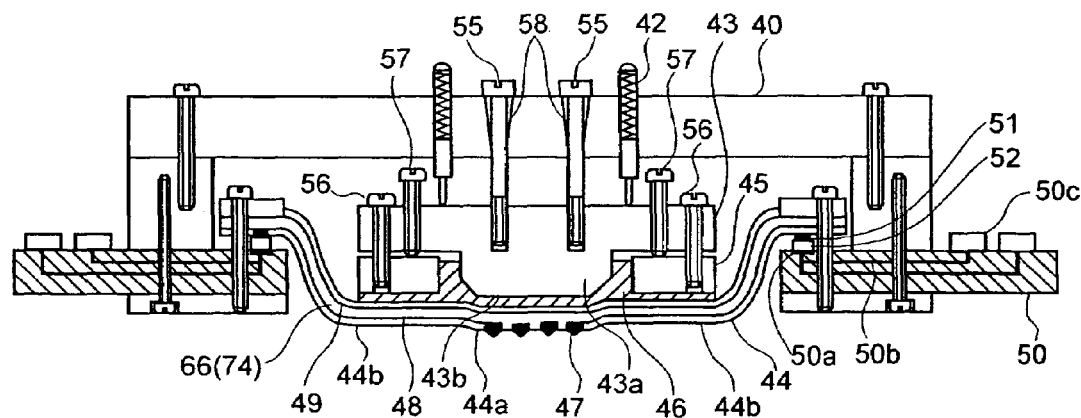
FIG. 6 is a cross sectional view showing an essential portion of the third embodiment of the connection device of this invention.
Figure 7:
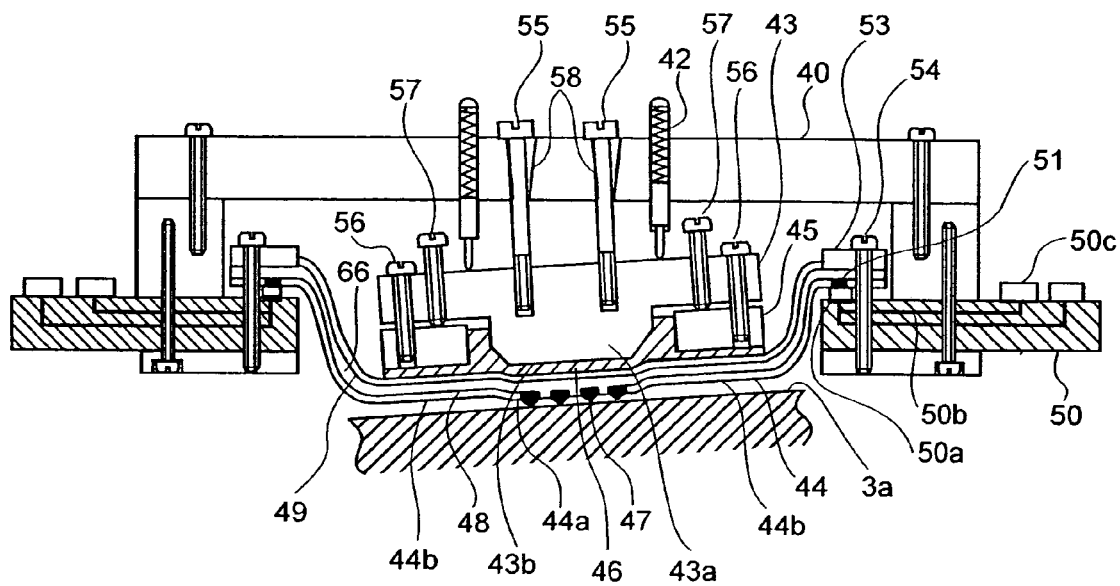
FIG. 7 is a cross sectional view showing the pointed contact terminals arrayed in the multilayer film in contact with the electrode surfaces of the device under test in the third embodiment of the connection device shown in FIG. 6.

FIG. 6 is a view showing an essential portion of the third embodiment of the connection device of this invention. In this third embodiment, instead of the center pivot 41 utilized in the first embodiment, knockpins 55 are utilized to maintain a slightly tilted status for the clamping member 43. More specifically, four knockpins 55 are installed at left and right and back and forth, centered symmetrically around the clamping member 43. These knockpins 55 are inserted in an upward expanding taper hole 58 formed in the support member 40 and are fastened in the clamping member 43. All other structures are identical to the first embodiment shown in FIG. 2. In other words, in order that the surface with the plurality of pointed contact terminals 47 is made parallel with the overall surface 3a of the electrode 3 on the single or plurality of semiconductor devices, as shown slightly exaggerated in FIG. 7, along with each of the knockpins 55 installed in the clamping member 43 maintaining a tilt capability below the upward expanding taper holes 58 formed in the support member 40, a constant, fixed low load pressing force (about 3 to 50 mN per pin) is applied by the spring probe 42 installed so as to be centered symmetrically front and back and right and left versus the clamping member 43 in response to vertical displacement of the clamping member 43. In other words, a compliance mechanism to apply a low load per pin is formed by the engagement between each of the knockpins 55 fastened in the clamping member 43 and the upward expanding taper holes 58 formed in the support member (upper clamp plate) 40, as well as by the symmetrically installed spring probes 42. The follow up and paralleling of the plurality of points of contact pins 47 with one or a plurality of surfaces 3a of the electrode 3 is performed by this compliance mechanism. First of all, as shown in FIG. 6, the pressing force applied by the spring probe 42 on the clamping member 43 positions the heads of each knockpin 55 in direct contact with the upper surface of the support member 40. Next, the compliance mechanism is formed by means of the taper holes 58 formed in the support member 40 and each of the knockpins 55 installed in the clamping member 43 so that, as shown in FIG. 7, each of the knockpins 55 slide in the taper holes 58 by means of a uniform pressing force on the clamping member 43 due to the spring probes 42, and the tilt of the knockpins 55 makes the clamping member 43 freely follow up on (trace) the overall surface 3a of the electrode 3, and, along with making the surface with the plurality of pointed contact terminals parallel with the overall surface 3a of the electrode 3, variations greater than ±2 μm in the height of the individual contact terminal points are absorbed by localized warping of the cushioning layer 46, and contact performed with the electrode (material) 3 arrayed on the semiconductor wafer 1 with height variations maintained within ±0.5 μm, and uniform, low load, probing (about 3 to 50 mN per pin) can be achieved.

Figure 8:
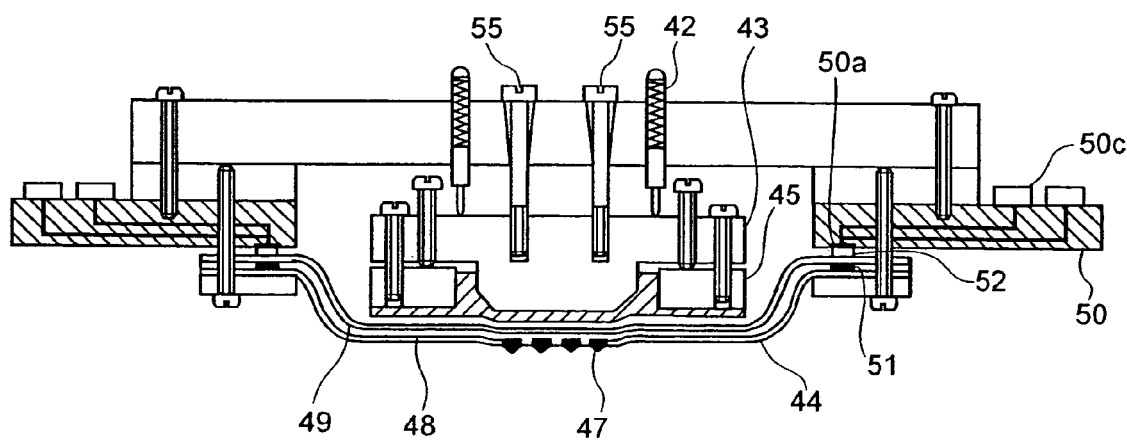
FIG. 8 is a cross sectional view showing an essential portion of the fourth embodiment of the connection device of this invention.

FIG. 8 is a cross sectional view showing an essential portion of the fourth embodiment of the connection device of this invention. In this fourth embodiment of the connection device, a connected fillet 51 filled with metallic plating at the upper edge of the lead out wiring 48 positioned below the circuit board 50 at the boundary of the multilayer film 44 may make direct contact with electrode 50a formed on the lower side of the circuit board 50 or may be connected by an anisotropic conductive sheet 52 or by solder, etc. In other words, in this fourth embodiment of the invention, the edge of the lead out wire 48 for the multilayer film 44 can be formed on the upper edge by means of the fillet 51, and connected with the electrode 50a installed at the bottom of the circuit board 50. All other structures are identical to the third embodiment shown in FIG. 6.

Figure 9:
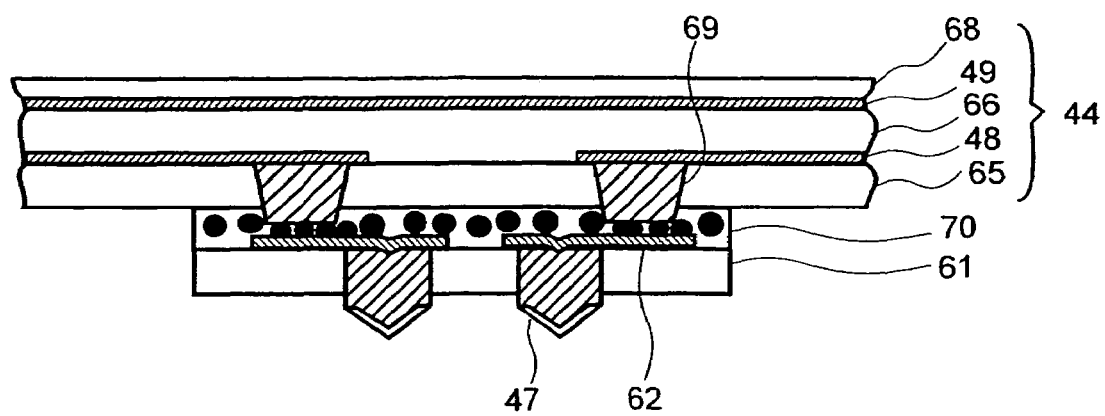
FIG. 9 is a cross sectional view showing the contact terminals arrayed on the multilayer film in the fifth embodiment of the connection device of this invention.

FIG. 9 is a view showing an essential portion of the fifth embodiment of the connection device of this invention. The structure in the fifth embodiment, in the multilayer film 44, for connecting the lead out wires 48 and the connection terminals 47 is different from previous embodiments, however it is otherwise configured identically to the connection devices shown in FIGS. 2, 5, 6 and 8. In other words, in this fifth embodiment, as shown in FIG. 9, a polyimide film 61 is formed only in the area arrayed with the electrodes 3 of the device under test, and a plurality of contact terminals 47 are arrayed to correspond to the electrodes 3 in the polyimide film 61. The electrodes 62 formed on the polyimide film 61 connected to the contact terminals 47 are made to connect to the electrode 69 of the polyimide film 65 forming the lead out wire 48 by means of an anisotropic conductive sheet 70. A multilayer film 44 formed with contact terminals 47 is accomplished by an integrated connection of the anisotropic conductive sheet 70 and the polyimide film 61. This multilayer film 44 may be formed beforehand for instance from a wiring film comprised of a polyimide film 65, a layout wire 48, an intermediate polyimide film 66, a ground layer 49 and a polyimide protective film 68.

Figure 10:
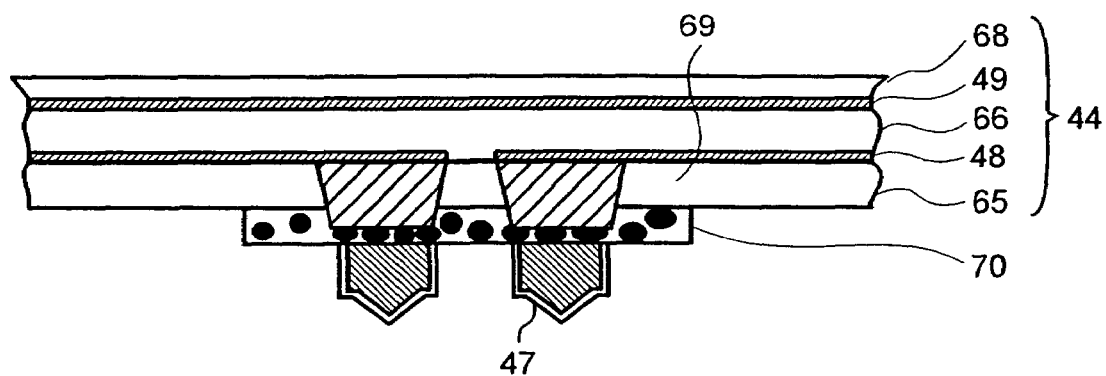
FIG. 10 is a cross sectional view showing the contact terminals arrayed on the multilayer film in the sixth embodiment of the connection device of this invention.

FIG. 10 is a view showing an essential portion of the sixth embodiment of the connection device of this invention. The structure of this sixth embodiment for connecting the lead out wires 48 in the multilayer film 44, with the connection terminals 47, is different from the previous embodiments, however it is otherwise configured identically to the connection devices for the embodiments shown in FIGS. 2, 5, 6 and 8. In other words, in this sixth embodiment, as shown in FIG. 10, the contact terminals 47 are formed of the multilayer film 44 by making the contact terminals 47 contact the electrode 69 of the polyimide film 65 formed of the lead out wire 48, by means of an anisotropic conductive sheet 70. This multilayer film 44 may be formed beforehand for instance from a wiring film comprised of a polyimide film 65, a layout wire 48, an intermediate polyimide film 66, a ground layer 49 and a polyimide protective film 68.

Figure 17:
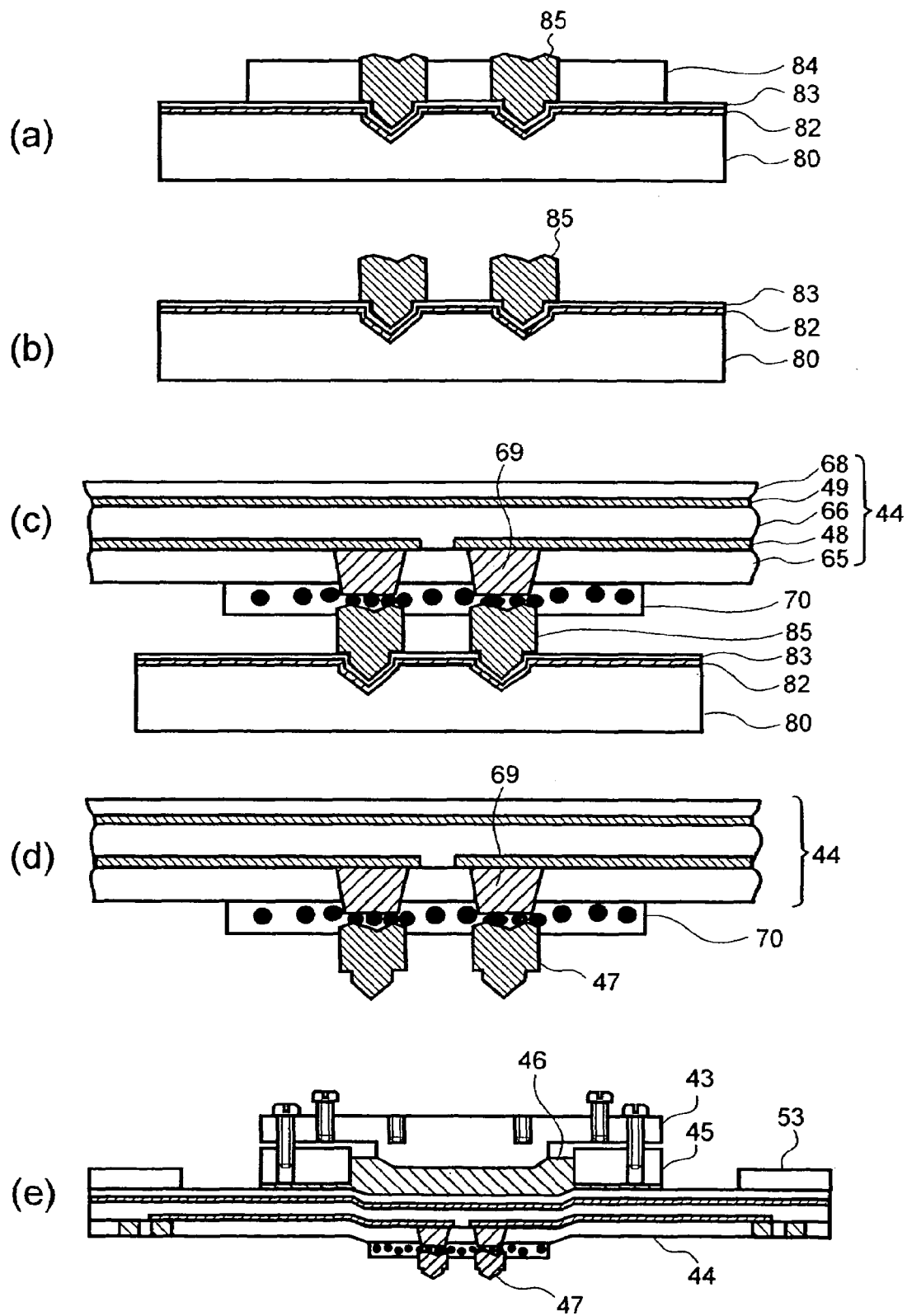
FIGS. 17(a) to 17(e) are cross sectional views showing steps in the manufacturing process for manufacturing the multilayer film containing the clamping member and frame for the sixth embodiment of the connection device of this invention.
Figure 19:
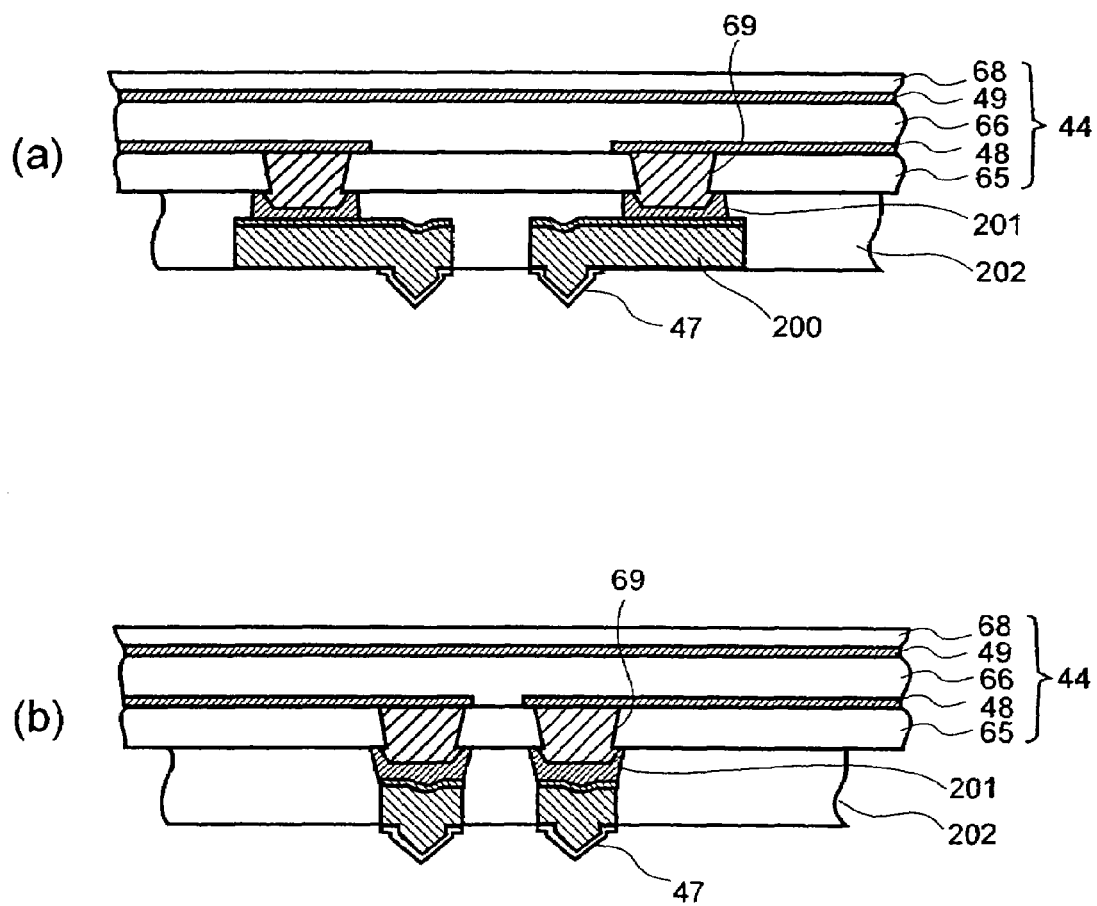
FIG. 19(a) is a cross sectional view showing a portion of the multilayer film arrayed with the contact terminals in the seventh embodiment of the connection device of this invention.
FIG. 19(b) is a cross sectional view showing a portion of the multilayer film arrayed with the contact terminals in the eighth embodiment of the connection device of this invention.

FIG. 19(a) is a view showing an essential portion of the seventh embodiment of the connection device of this invention. The structure of this sixth embodiment for connecting the lead out wires 48 in the multilayer film 44, with the connection terminals 47, is different from the previous embodiments, however it is otherwise configured identically to the connection devices for the embodiments shown in FIGS. 2, 5, 6 and 8. In other words, as shown in FIG. 19(*a*), the seventh embodiment has a plurality of contact terminals 47 arrayed in the mold 80 of the silicon wafer, as described later with reference to FIG. 17(*b*), to correspond to the electrodes 3 of the device under test. The electrodes 200 formed as an integrated piece with the contact terminals are connected by way of the solder 201 to the electrode 69 formed from the polyimide film 65 forming the lead out wire 48, and the contact terminals 47 formed with the multilayer film 44 by means of the integrated coupling of the polyimide film 65, the solder 201 and the electrode 200. This multilayer film 44 may be formed beforehand for instance from a wiring film comprised of a polyimide film 65, a layout wire 48, an intermediate polyimide film 66, a ground layer 49 and a polyimide protective film 68. The electrodes 69 of the polyimide film 65 and the electrodes 200 integrated into one piece with the contact terminals 47 are covered with a resin 202 which forms a protective film. An epoxy type resin or an acrylic type thermosetting resin or a thermoplastic resin may for instance be utilized as the resin 202. As a method of forming the protective film of resin 202, after, for instance, soldering the electrode 69 of the polyimide film 65 with the electrode 200 of the contact terminals 47, a resin 202 is poured from a dispenser into the gap between the silicon wafer mold 80 and the polyimide film 65, the resin is and then formed by thermosetting, or alternatively the resin 202 can be injected between the silicon wafer mold 80 constituting the contact terminals 47, and the multilayer film 44 formed the solder 201 and heat pressurization performed, and the resin 202 layer is then formed by connecting the solder 201 between the electrode 69 and the electrode 200. A crystallized tin/lead mixture or a tin-lead solder may used as the solder used in forming the protective film.

The resin 202 can also be omitted.

FIG. 19(*b*) is a cross sectional view showing a portion of the multilayer film arrayed with the contact terminals in the eighth embodiment of the connection device of this invention. The structure of this eighth embodiment for connecting the lead out wires 48 in the multilayer film 44, with the connection terminals 47, is different from the previous embodiments, however it is otherwise configured identically to the connection devices for the embodiments shown in FIGS. 2, 5, 6 and 8. In other words, as shown in FIG. 19(*b*) of the eighth embodiment, a multilayer film 44 formed with contact terminals 47 is produced by making the contact terminals 47 contact, by means of the solder 201, the electrode 69 of the polyimide film 65 formed of the lead out wire 48. This multilayer film 44 may be formed beforehand for instance from a wiring film comprised of a polyimide film 65, a layout wire 48, an intermediate polyimide film 66, a ground layer 49 and a polyimide protective film 68. The electrodes 69 of the polyimide film 65 and the electrodes 200 integrated into one piece with the contact terminals 47 are covered with a resin 202 which forms a protective film. An epoxy type resin or an acrylic type thermosetting resin or a thermoplastic resin may for instance be utilized as the resin 202. A crystallized tin/lead mixture or a tin-lead solder may used as the solder used in forming the protective film.

Figure 20:
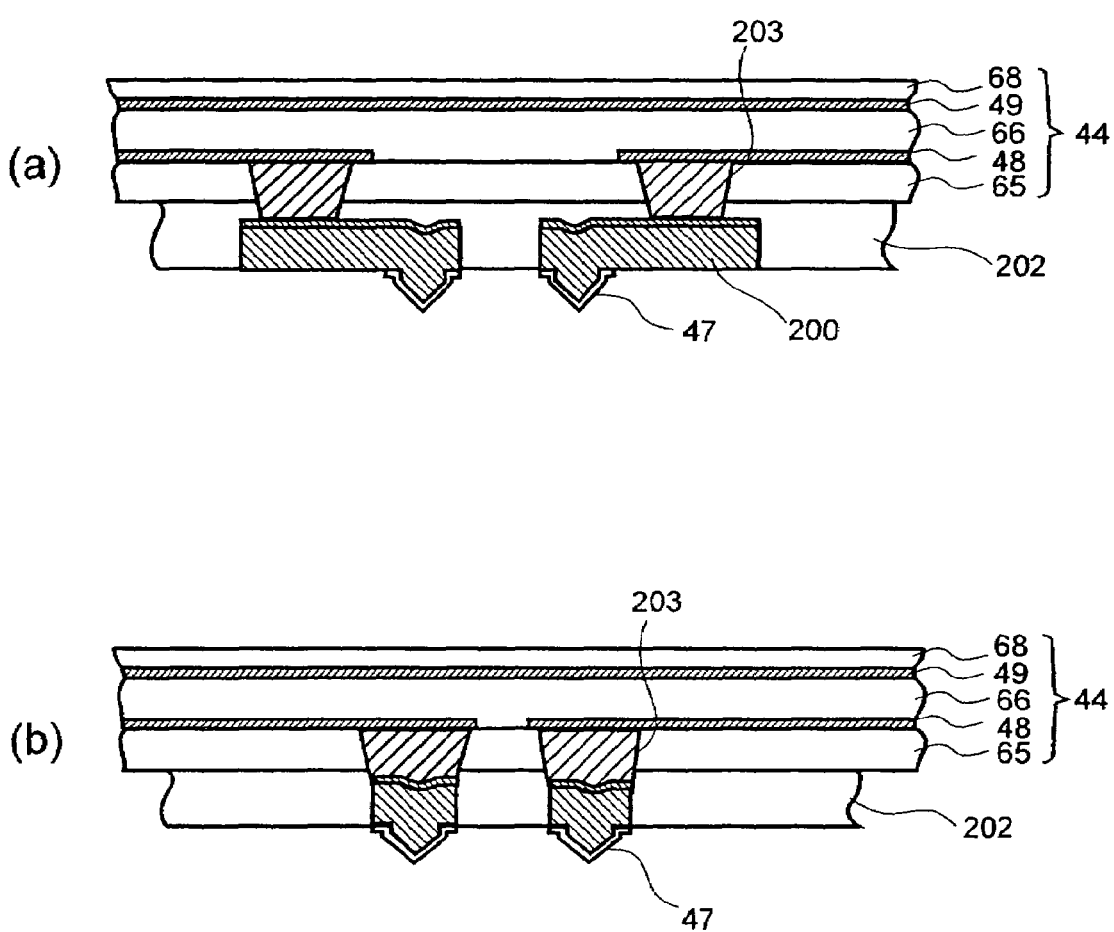
FIG. 20(a) is a cross sectional view showing a portion of the multilayer film arrayed with the contact terminals in the ninth embodiment of the connection device of this invention.
FIG. 20(b) is a cross sectional view showing a portion of the multilayer film arrayed with the contact terminals in the tenth embodiment of the connection device of this invention.

FIG. 20(*a*) is a cross sectional view showing a portion of the multilayer film arrayed with the contact terminals in the ninth embodiment of the connection device of this invention. The structure of this ninth embodiment for connecting the lead out wires 48 in the multilayer film 44 with the connection terminals 47 is different from the previous embodiments, however it is otherwise configured identically to the connection devices for the embodiments shown in FIGS. 2, 5, 6 and 8. In other words, as shown in FIG. 20(*a*), the ninth embodiment has a plurality of contact terminals 47 arrayed in the mold 80 of the silicon wafer, as described later with reference to FIG. 17(*b*), to correspond to the electrodes 3 of the device under test, and the electrodes 200 formed in an integrated piece with the contact terminals 200 are connected to the solder fillet electrode 203 formed in the polyimide film 65 forming the lead out wire 48 and then forming the multilayer film 44 comprising contact terminals 47 by means of the integrated coupling of the polyimide film 65, the solder fillet electrode 203 and the electrode 200. The structure of this multilayer film 44 and the protective film of resin 202 are the same as the seventh embodiment. The solder fillet electrode 203 is made by forming solder plating in the lead out wiring 48.

FIG. 20(*b*) is a view showing an essential portion of the multilayer film arrayed with the contact terminals in the tenth embodiment of the connection device of this invention. In this tenth embodiment of the connection device, the portion connecting the contact terminals 47 and the lead out wiring 48 in the multilayer film 44 differs in connecting directly on the contact terminals 47, but otherwise it is the same as the ninth embodiment in FIG. 20(*a*) with the same structure for the embodiment of the connection device shown in FIGS. 2, 5, 6 and 8.

Figure 21:
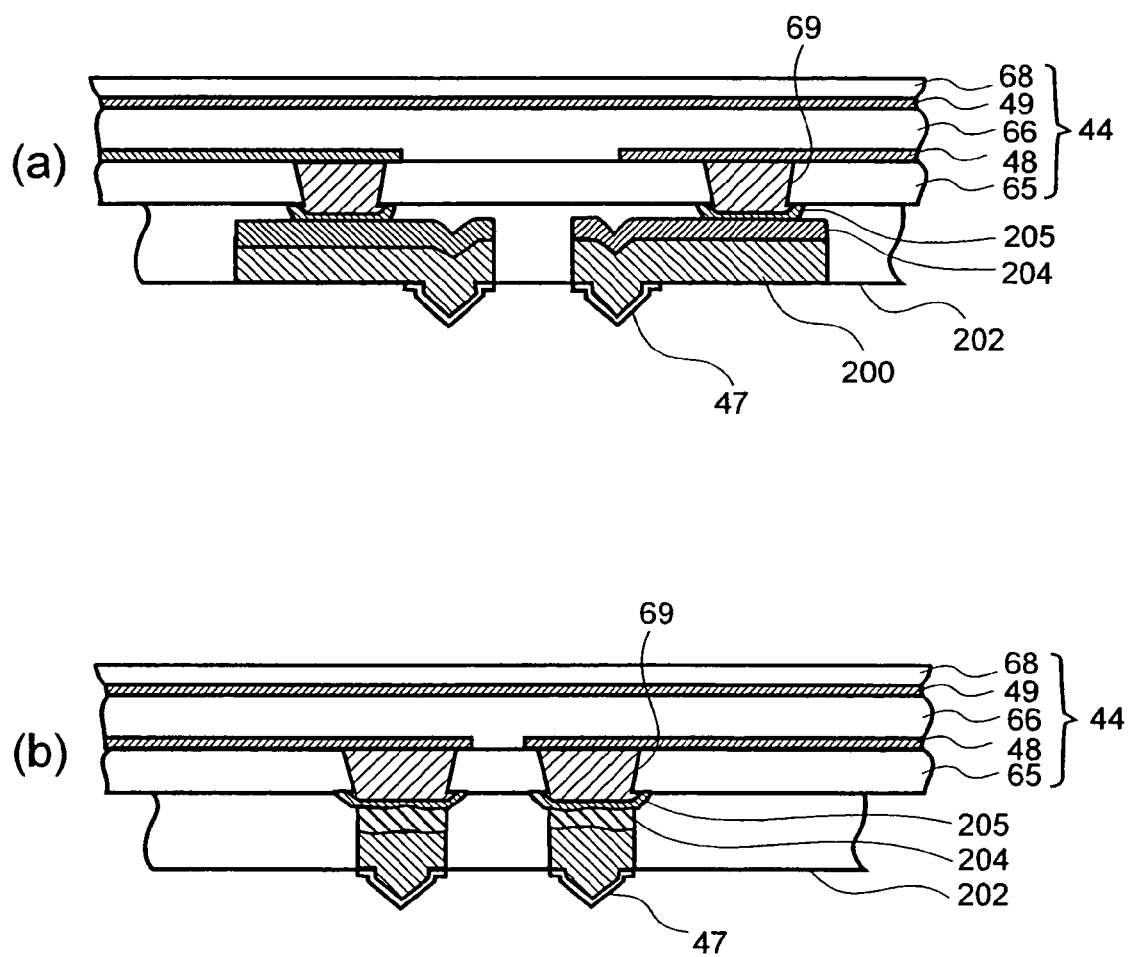
FIG. 21(a) is a cross sectional view showing a portion of the multilayer film arrayed with the contact terminals in the eleventh embodiment of the connection device of this invention.
FIG. 21(b) is a cross sectional view showing a portion of the multilayer film arrayed with the contact terminals in the twelfth embodiment of the connection device of this invention.

FIG. 21(*a*) is a view showing a essential portion of the multilayer film arrayed with the contact terminals in the eleventh embodiment of the connection device of this invention. The structure of this tenth embodiment for connecting the lead out wires 48 in the multilayer film 44 with the connection terminals 47 is different from the previous embodiments, however it is otherwise configured identically to the connection devices for the embodiments shown in FIGS. 2, 5, 6 and 8. In other words, as shown in FIG. 21(*a*) the eleventh embodiment has a plurality of contact terminals 47 arrayed in the mold 80 of the silicon wafer, as described later with reference to FIG. 17(*b*), to correspond to the electrodes 3 of the device under test, tin plating 204 formed on the surface of the electrodes 200 integrated with each contact terminal, and gold plating 205 formed on the electrode 69 of the polyimide film 65 forming the lead out wire 48 are subjected to heat expansion, connected by forming a lead alloy and a multilayer film 44 comprising the contact terminals 47 formed by an integration of the polyimide film 65 and the electrode 200.

This multilayer film 44 may be formed be forehand for instance from a wiring film comprised of a polyimide film 65, a lead out wire 48, an intermediate polyimide film 66, a ground layer 49 and a polyimide protective film 68.

The tin plating 204 can be gold plating and the gold plating 205 can be tin plating so that a lead/gold alloy for heat expansion can be formed by mutual substitution of materials.

FIG. 21(*b*) is a view showing an essential portion of the multilayer film arrayed with the contact terminals in the twelfth embodiment of the connection device of this invention. In this twelfth embodiment of the connection device, the portion connecting the contact terminals 47 and the lead out wiring 48 in the multilayer film 44 differs in connecting directly on the contact terminals 47, but otherwise it is the same as the eleventh embodiment in FIG. 2(*a*) with the same structure for the embodiment of the connection device shown in FIGS. 2, 5, 6 and 8.

In the above mentioned embodiments 1 through 12, the contact terminals 47 were formed of conductive material. The contact terminals 47 were consequently of harder material at that portion than the multilayer film (wiring film) 44 so that more satisfactory contact could be made when in direct contact with the electrodes of the item under test.

Figure 11:
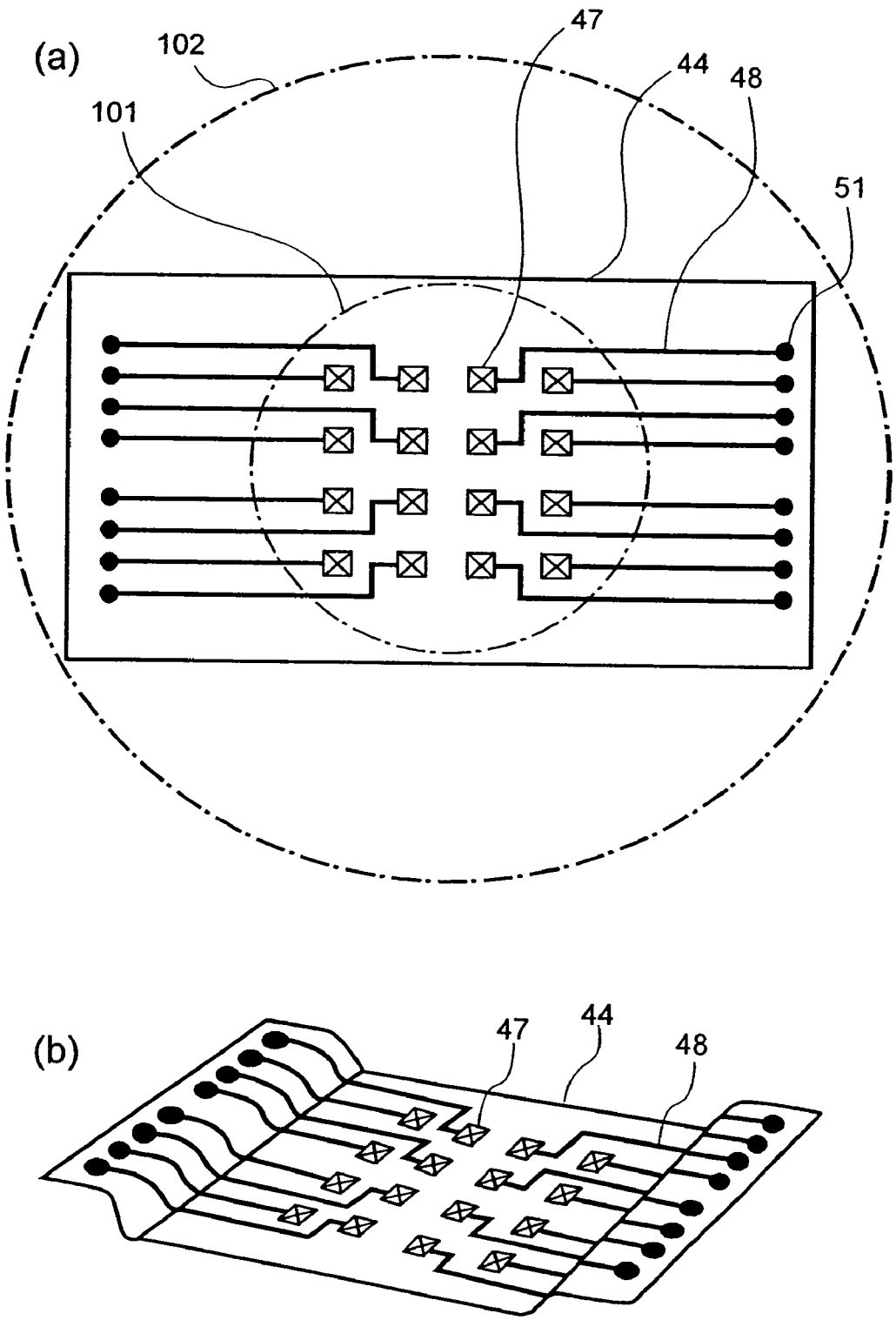
FIG. 11(a) is a flat view showing an embodiment of the contact terminals and layout wiring formed from polyimide film in the connection device of this invention.
FIG. 11(b) is a perspective view of the same contact terminals and layout wiring.
Figure 12:
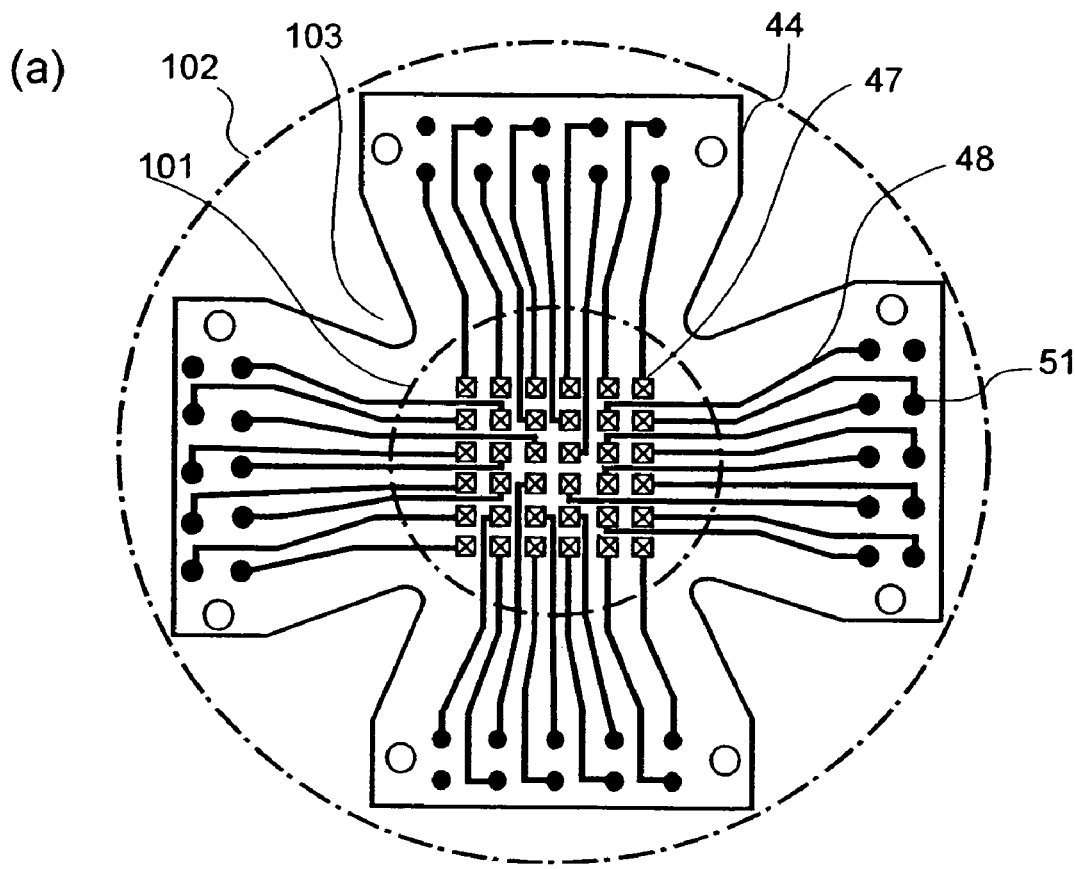
FIG. 12(a) is a plan view showing another embodiment of the contact terminals and layout wiring formed from polyimide film in the connection device of this invention.
FIG. 12(b) is a perspective view of the same contact terminals and layout wiring.
Figure 12:
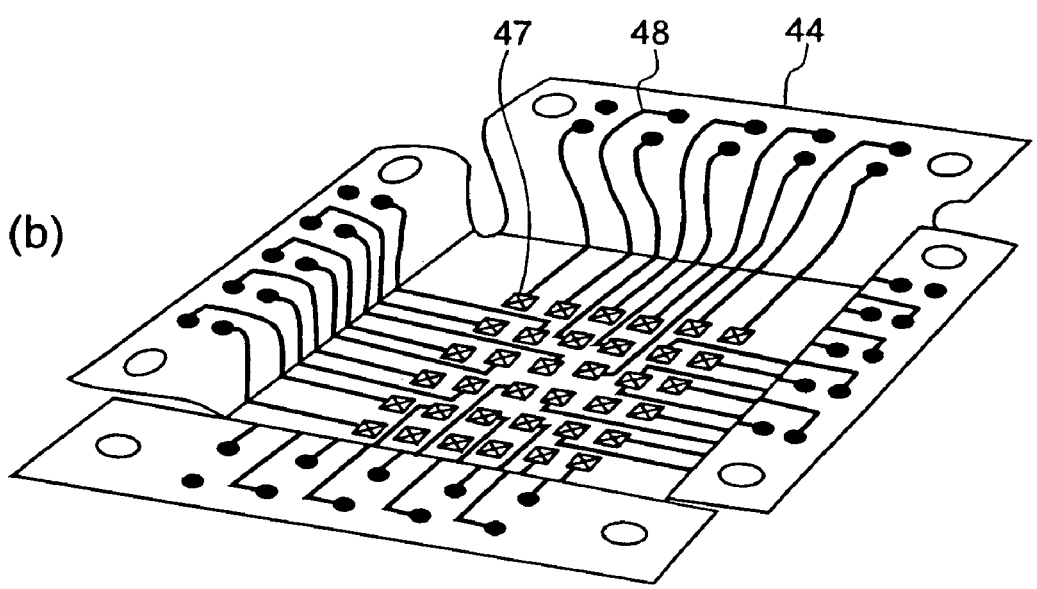

The placement of the contact terminals as well as the wiring patterns of the lead out wiring 48 in these connection devices were structured in various types corresponding to the electrode pattern of the item under test such as a semiconductor integrated circuit. The first and second embodiments of these patterns are shown in FIG. 11 and FIG. 12.

FIG. 11(a) is a flat view showing an embodiment of the contact terminals and layout wiring formed from polyimide film. FIG. 11(b) is a perspective view of the same contact terminals and layout wiring showing the multilayer film in a bent state. FIG. 12(a) is a flat view showing another embodiment of the contact terminals and layout wiring formed from polyimide film. FIG. 12(b) is an oblique view of the same contact terminals and layout wiring showing the multilayer film in a bent state. In these figures, in order to simplify the descriptions, the number of contact terminals and lead out wires are reduced and are displayed at a low density. In actual use of course, a plurality of contact terminals can be installed and a high density configuration may be used.

In the connection device as shown for example in FIGS. 11(a), 11(b) and FIGS. 12(a) and 12(b), on the multilayer film 44 comprised of polyimide resin, the lead out wiring 48 is connected at one end to the contact terminals 47 installed at positions corresponding to the electrodes 3 of the item under test, and the lead out wiring 48 is connected at the other end to the fillet 51 installed at the periphery of the multifilm layer 44. This lead out wiring 48 can be wired in various configurations. The wiring for instance can be laid out in one direction or can be laid out in a radial shape. More specifically, the multilayer film 44 is formed in a square shape and the lead out wiring 48 connected to the fillets 51 installed at all sides of the square shapes on the multilayer film 44 as shown in the first embodiment in FIGS. 12(a) and 12(b). The multilayer film 44 is formed in a rectangular shape in FIGS. 11(a) and 11(b) in the second embodiment and connects to the fillets 51 on both edges.

Next, the concepts for manufacturing the connection devices of these embodiments will be described.

As a method of laying out the wiring for the connection device for transmitting electrical signals to the test unit, when for instance, the item under test is wafer (LSI) formed with electrodes on the surface of the LSI, the process is as described next. First of all, as shown in FIG. 11(a) and FIG. 12(a), a contact terminal mold 102 for silicon wafers one size larger than the area 101 of the applicable LSI wafer is utilized, a mask of silicon dioxide is formed by anisotropic etching of a silicon wafer as a mold and the holes used for forming the contact terminals 47 in the area 101 the same as the applicable LSI water. Then, using this now fabricated mold, the protuberances are made for forming the contact terminal 47. Further, a multilayer film 44 comprised of a polyimide film and a lead out wiring 48 is connected to the surface of the contact terminal mold 102. An opening 103 is formed in the multilayer film 44 as needed as shown in FIG. 11(a). Then, the area formed for the contact terminals 47 is secured to the frame 45 on the rear of the multilayer film 44 corresponding to the test area 101 on the applicable LSI wafer as shown in FIG. 11(b) or FIG. 12(b) and bent in a polygonal shape. Still further, a cushioning layer 46 is fit inwards between the clamping member 43 and the multilayer film 44 with the frame as shown in FIG. 2, FIG. 5, FIG. 6 and FIG. 8, and, after installing it into an integrated shape, the contact terminal mold 102 is then removed, and an upper clamp board 40 as well as a circuit board 50 is placed thereon. The fillet 51 lead out wiring 48 is connected to the electrodes 50a of said circuit board 50 with a conductive sheet 52 or solder and the multilayer film clamp member 53 is connected by screws 54 to the circuit board 50.

The above example is directed to the case where contact is made in one batch with all electrodes of the semiconductor devices formed on the wafer of the item under test but this invention is not limited to this example. The multilayer film for instance may be manufactured with an area smaller than the wafer size for a connection device for instance for testing semiconductor devices separately or simultaneously testing an optional number of semiconductor devices.

The manufacture and the manufacturing method for contact terminals of the first embodiment of the connection device of this invention will be described next.

Figure 13:
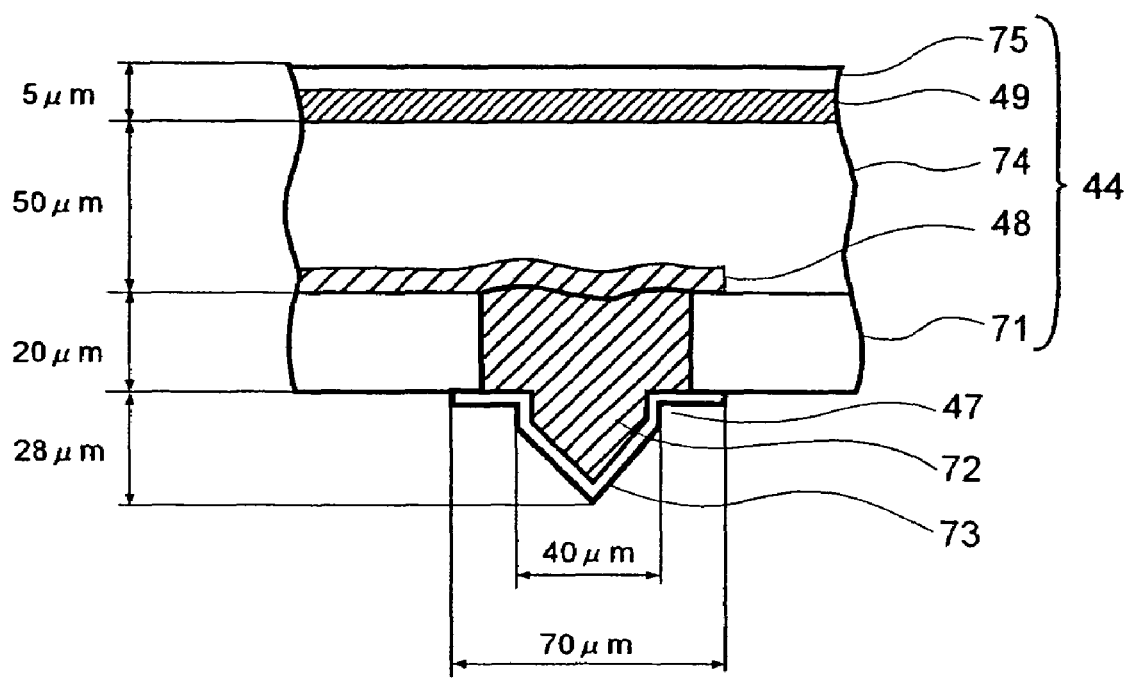
FIG. 13 is cross sectional view showing the shape and dimensions of the multilayer film arrayed with contact terminals in the connection device of this invention.

The contact terminal portion shown in FIG. 13 has a polyimide film 71 in the bottom layer as the multilayer film 44 and also has a bump 72 for forming the protuberance (tip), and a plated film 73 in that tip. One surface (side facing the board) of the polyimide film 71 is formed by a lead out wiring 48, a polyimide film 74, a ground layer 49 and a polyimide protective film 75. The lead out wiring 48 is installed to make that end contact the bump 72. The contact terminal 47 is formed for instance, with a point in a pyramid shaped bump 72 and with a plating film 73 formed on the surface of the point of this bump 72. This bump 72 is formed for instance of nickel which has a high degree of hardness and is easily plated. The plating film 73 is formed of rhodium and is even harder than the nickel film. The reason for utilizing rhodium as the plating film 73 is that the hardness of the rhodium is considerably greater than that of the nickel film.

Typical dimensions for the contact terminal in the first embodiment of the connection device of this invention are shown in FIG. 13. More specifically, to be compatible with semiconductor devices having an electrode with a narrow pitch less than 0.2 mm, such as for example 0.13 mm or 0.1 mm, the ground layer 49 and the polyimide protective film 75 have a thickness of approximately 5 μm, the polyimide film 74 has a thickness of approximately 50 μm, the polyimide film 71 has a thickness of approximately 20 μm, the tip of the contact terminal 47 has a height of approximately 28 μm, and the width at the bottom of the tip is approximately 40 μm. In the first embodiment, one side of the lower portion is comprised of a pointed contact terminal with a point in a four-sided pyramid shape of for example 10 to 60 μm. This die for the four-sided pyramid is made as a pattern with lithographic techniques and so the size can be determined with high precision. A sharply defined shape can be achieved by forming it with anisotropic etching. The tip in particular, can be made in a pointed shape and is the same in the other embodiments.

The contact terminal 47 of this embodiment is further capable of easily adapting to semiconductor devices with an electrode pitch narrower than 0.1 mm, to a range of 10 to 20 μm. More specifically, one side of the bottom of the contact terminal 47 can easily be formed to a size of 5 μm. In terms of the multilayer film, the height of the contact terminal 47 can be achieved at a precision within ±2 μm during forming, and, as a result, even when utilizing the clamping member (clamp plate) 43 on the area 44a arrayed with a plurality of contact terminals 47 to enclose the cushioning layer 46 and cause a projection to eliminate slack in the multilayer film itself, the height precision of the contact terminal 47 can be acquired within a precision of ±2 μm. Therefore stable and low load probing (about 3 to 50 mN per pin) of electrodes 3 array on a semiconductor device can be achieved.

The reason for selecting a pointed shape for the tip of the contact terminal 47 is related as follows.

An oxidized surface is formed when utilizing material such as aluminum for the electrode 3 of the item under test so that the resistance is consequently unstable when making contact. In this kind of electrode 3, a stable resistance value can be obtained when the fluctuation in resistance is less than 0.5Ω so that a tip is required for the contact terminal 47 that can break through the oxidized surface of the electrode 3 and maintain satisfactory contact. As described in the prior art, when using a semicircular shape for the point of the contact terminal 47, a contact pressure greater than 300 mN per pin is required in order to rub the electrode against the contact terminals. On the other hand, when the tip of the contact terminal has a flat shape of a diameter within a range of 10 to 30 μm, a contact pressure greater than 100 mN per pin is required in order to rub the electrode against the contact terminals. Consequently, electrode material debris including an oxidized layer is generated, causing penetration of foreign objects and electrical shorts between the wiring, and a large contact pressure in excess of 100 mN can cause damage to the electrode or to the element directly below the electrode.

However, when utilizing a contact terminal 47 with a pointed tip as in the embodiment of this invention, a contact pressure of approximately 3 to 50 mN per pin is able to achieve electrical continuity at a stable resistance within 0.5Ω just with the pressing force and does not scar the electrode 3. Consequently, a low pin pressure is sufficient to make contact with the electrode so that no damage is applied to the electrode or to the element directly below the electrode. Also, the force needed to apply pin pressure to all of the contact terminals can be reduced. As a result, the load resistance of the prober drive device can be reduced in the equipment using this connection device and manufacturing costs can therefore be reduced.

If a load of 100 mN can be applied per pin by sticking the electrode with a four sided pyramid structure having a base with one side of about 40 μm, and if the tip is smaller than 30 μm, then a pointed shape need not be used for the contact terminal. However, for the above mentioned reasons, the tip area as much as possible should be reduced to obtain a point with a surface area reduced to 5 μm or less.

Also, using a contact terminal 47 with a pointed tip assures that there is no striking or gouging of the electrode 3, and a low push pressure of approximately 3 to 50 mN per pin is sufficient for making contact so that no debris is generated from the electrode material. As a result, there is no need for a cleaning process to remove electrode material debris after probing and thus the manufacturing cost can be reduced.

Figure 14:
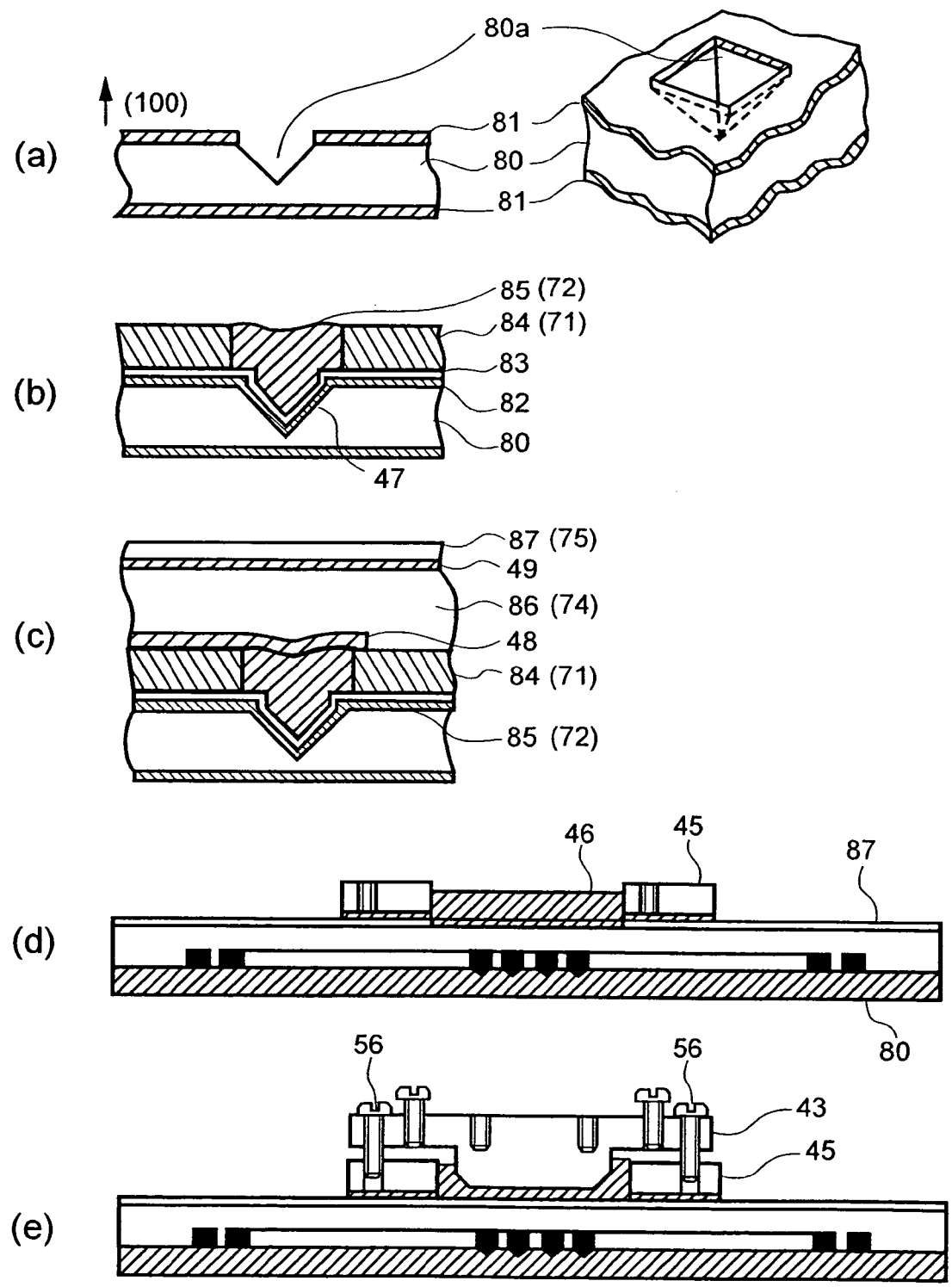
FIGS. 14(a) to 14(e) are cross sectional views showing steps in the first half of the manufacturing process for manufacturing the multilayer film containing the clamping member and frame for the first through fourth embodiments of the connection device of this invention.
Figure 15:
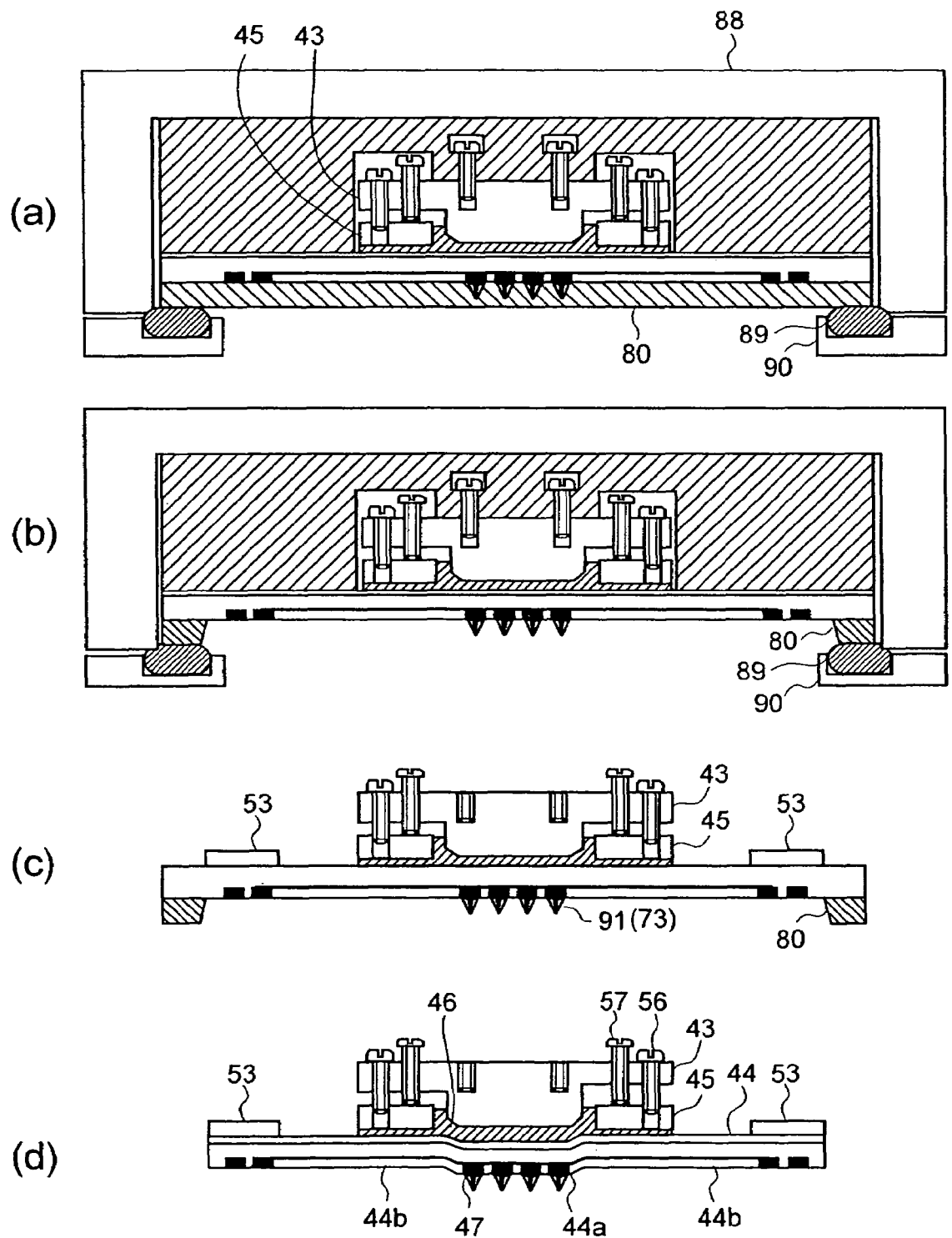
FIGS. 15(a) to 15(d) are cross sectional views showing steps in the latter half of the manufacturing process for manufacturing the multilayer film containing the clamping member and frame for the first through fourth embodiments of the connection device of this invention.

Next, the manufacturing process for forming the connection device (probing device) is shown in FIG. 2, FIG. 5, FIG. 6 and FIG. 8 while referring to FIG. 14 and FIG. 15. In particular, in the manufacturing process for forming the connection device shown in FIG. 2, the manufacturing process sequence of FIG. 14 and FIG. 15 is used for showing utilization of a four-sided pyramid hole formed by anisotropic etching on the die for silicon wafer 80, in a state with a thin film formed with the four-sided pyramid contact terminal point, a freely adjustable connection device can be assembled by means of the cushioning layer 36 and the spring probe 32 by way of the center pivot 31.

The process is first implemented while referring to FIG. 14(*a*). In this process, a silicon dioxide film 81 is formed to approximately 0.5 μm by heat oxidizing on both sides of a silicon wafer 80 (100) with a thickness of 0.2 to 0.6 mm. Next, etching of the silicon dioxide film 81 is performed by photo-resist masking. Anisotropic etching is performed on the silicon wafer 80 using the silicon dioxide film 81 as a mask and the hole 80*a* is etched in a four-sided pyramid shape enclosed by the (111) surface. In other words, the four-sided pyramid shaped hole 80*a* is etched within an enclosed (111) surface by anisotropic etching using the silicon dioxide film 81 as a mask.

Next, the process shown in FIG. 14(*b*) is implemented. In this process, a silicon dioxide film 82 is formed to about 0.5 μm by heat-oxidizing in wet oxygen on the surface (111) of the anisotropically etched silicon wafer 80. Next a conductive coating 83 is formed over the silicon dioxide film 82 and then a polyimide film 84 (71) is formed as the multilayer film on the surface of the conductive coating 83. After then removing the polyimide film 84 (71) down to a surface of the conductive coating 83 at the positions where the contact terminals 47 are to be formed, electrical plating using high hardness nickel as the main constituent is performed with the conductive coating 83 as the electrode at the exposed openings where the polyimide film 84 (71) was removed and the bump 85 (72) is formed as the contact terminal. Besides nickel as a material for forming the bump 85 (72) as the electrically plated contact terminal 47, copper has been proposed, however copper (CU) is relatively soft and cannot be used alone.

Next, the process shown in FIG. 14(*c*) is implemented. In this process, a copper layer is formed by a sputtering process or vapor deposition process on the surface of the polyimide film 84 and the bump 85 (72) to form a conductive film with a thickness of approximately 1 micrometer. The layout wiring 48 is formed by a photoresist process to form the wiring on this surface, and an intermediate polyimide film 86 (74) is then formed on the surface of the polyimide film 84. Next, a ground layer 49 is formed on this surface and a polyimide protective film 87 (75) further is formed over that surface.

The process shown in FIG. 14(*d*) is next implemented. In this process, a frame 45 is positioned and bonded to the surface of the protective polyimide film 87 (75) and a silicon coating material is next supplied inside the frame 45 as the cushioning layer 46. In this embodiment, an elastomer is utilized as a silicon coating material with, for instance, a hardness (JISA) of 15 to 70 and a thickness of 0.5 to 3 mm. However, the coating material is not restricted to elastomers. The elastomer may be used as an elastomer in a sheet shape and the elastomer itself need not be used. The cushioning layer 46 functions to alleviate the overall impact of contact from the points of the plurality of contact terminals 47 during contact with the electrodes 3 arrayed on the semiconductor wafer 1. The cushioning layer 46 also deforms locally to absorb variations greater than ±2 μm in the height of the individual contact terminals 47 in order to ensure that uniform contact is achieved with variations within ±0.5 μm in the height of the electrodes 3 arrayed on the semiconductor wafer 1. The task of alleviating the overall impact is a small task in this particular embodiment of the invention since the load imposed on each pin is low. Accordingly, if variation in the height of the contact terminals 47 can be maintained within ±0.5 μm, then the cushioning layer is not always necessary. As one method to achieve height variations within ±0.5 μm for the points of the contact terminals 47, a contact terminal 47 group formed in the multilayer film 44 may be pressed down in one batch on a silicon substrate maintained at a prescribed level.

The process shown in FIG. 14(e) is next implemented. In this process, the clamping member 43 is secured to the frame 45 with a screw 56.

Next, the process shown in FIG. 15(a) is implemented. In this process, a silicon wafer 80 is mounted via the O-ring 89 between the stainless steel lid 90 and the multilayer film 44 screwed to the frame 45 on the clamping member 43, in a stainless clamping jig 88 for etching of the silicon wafer 80 used as the die.

The process shown in FIG. 15(b) is next implemented. In this process, etching removal is performed for the silicon wafer 80 and the conductive covering 83.

Next, the process shown in FIG. 15(c) is implemented. In this process, the multilayer film 44 screwed to the frame 45 on the clamping member 43 is removed from the lid 90, O-ring 89 and clamping jig 88. Next, rhodium plating 91 (73) is performed and then positioning and bonding of the multilayer film member 53 on the periphery of the multilayer film protective polyimide film 87 (75) is performed. The reason for performing rhodium plating 91 (73) on the surface of the bump 85 (72) of the contact terminals 47, comprised of material such as nickel, is that the material of the electrode 3 such as solder or aluminum is less prone to adhere, the hardness is greater than the material (nickel) of the bump 85 (72), contacts are not prone to oxidize and have a stable resistance value, and plating is easy to perform.

Next, the process shown in FIG. 15(d) is implemented. In this process, the multilayer film is trimmed to the outer profile design dimensions and next the gap between the frame 45 and the clamping member (clamp plate) 43 is adjusted with the screw 57, and screw tightening of screw 56 makes the tip of the screw 57 come in direct contact with the top edge of the frame 45 so that the clamp member 43 advances with respect to the frame 45, and the pressing action of the clamping member 43 on the area 44a arrayed with the contact terminals 47 on the multilayer film 44, by way of the cushioning layer 46, causes an appropriate stretching in the multilayer film 44 film itself, so that slack is eliminated in multilayer film 44 itself and the level of the tips of the contact terminals can be maintained within a precision of ±2 μm.

Next, the assembly process is implemented and the connection device (probing device) comprised of a thin-film probe card is completed. More specifically, as shown in FIG. 2, the multilayer film 44 is installed onto the circuit board 50. Next, the taper (tilt) 43c is installed onto the upper surface of the clamping member 43 in a state where the lower spherical surface 41a of the center pivot is engaged with the taper (tilt) 43c. Next, along with installing the center pivot 41 to the support member (upper clamp plate) 40 attached to the spring probe 42, the circuit board 50 attached to the multilayer film 44 is installed at the periphery of the support member 40 to comprise the thin-film probe card.

When assembling the connection device (probing device) shown in FIG. 5, first of all, after installing the center pivot 41 to the clamping member 43, the multilayer film 44 can be attached to the circuit board 50.

When manufacturing the thin-film probe card of FIG. 6 or FIG. 8, other than installing knockpins 55 instead of a center pivot 41, onto the clamping member 43, the manufacturing of the thin-film probe card can be performed with the same processes as shown in FIG. 14 and FIG. 15.

The etching removal process for the silicon wafer 80 shown in FIGS. 15(a) and 15(b), may be implemented at a stage prior to bonding to the frame 45 shown in FIG. 14(c) or the bonding may be implemented at a stage (stage for bonding only of frame 45 shown in FIG. 14(c)) prior to installation of the clamping member 43 shown in FIG. 14(d).

The level of the tip height of the contact terminals 47 can be maintained, even without the cushioning layer 46, by utilizing a clamp plate 210 that integrates the frame 45 and the clamping member 43 so that the cushioning layer 46 is not needed.

Figure 22:
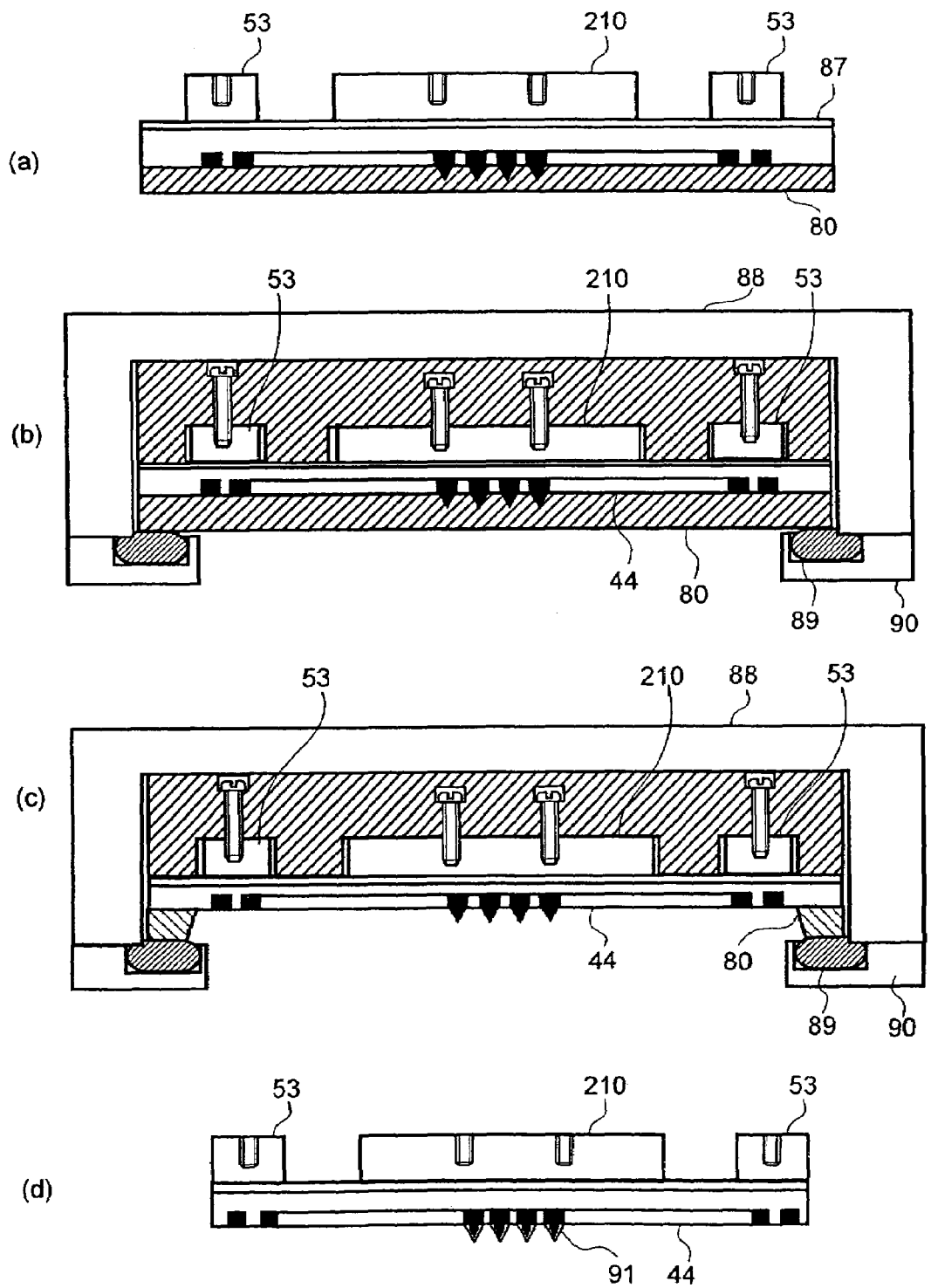
FIGS. 22(a) to 22(d) are is a cross sectional views showing the steps in manufacturing process for manufacturing the multilayer film containing the clamping plate for the first through fourth embodiments of the connection device of this invention.

The cushioning layer 46 is omitted in FIG. 22 and the working example of the manufacturing process utilizes the clamp plate 210.

In the manufacturing process utilizing the clamp plate 210, the process shown in FIG. 22(a) is implemented after the manufacturing process shown in FIG. 14(c) has been implemented. In this process, the clamp plate 210 and the multilayer film clamp member 53 in the periphery are aligned and bonded to the surface of the protective polyimide film 87 (75).

Next, the process in FIG. 22(b) is implemented. In this process, a silicon wafer 80 is mounted via the O-ring 89 between the stainless steel lid 90 and the multilayer film 44 clamped to the frame 45 on the clamping member 43, in a stainless clamping jig 88 for etching of the silicon wafer 80 used as the die.

Next, the process in FIG. 22(c) is implemented. In this process, etching removal is performed for the silicon wafer 80 and the conductive covering 83.

Next, the process shown in FIG. 22(d) is implemented. In this process, the multilayer film 44 screwed to the frame 45 on the clamping member 43 is removed from the lid 90, O-ring 89 and clamping jig 88. Next, the rhodium plating 91 (73) is applied and the multilayer film 44 trimmed to the outer profile design dimensions.

The assembly process is implemented the same as in FIG. 15 and the connection device (probing device) comprised of a thin-film probe card is completed.

Figure 16:
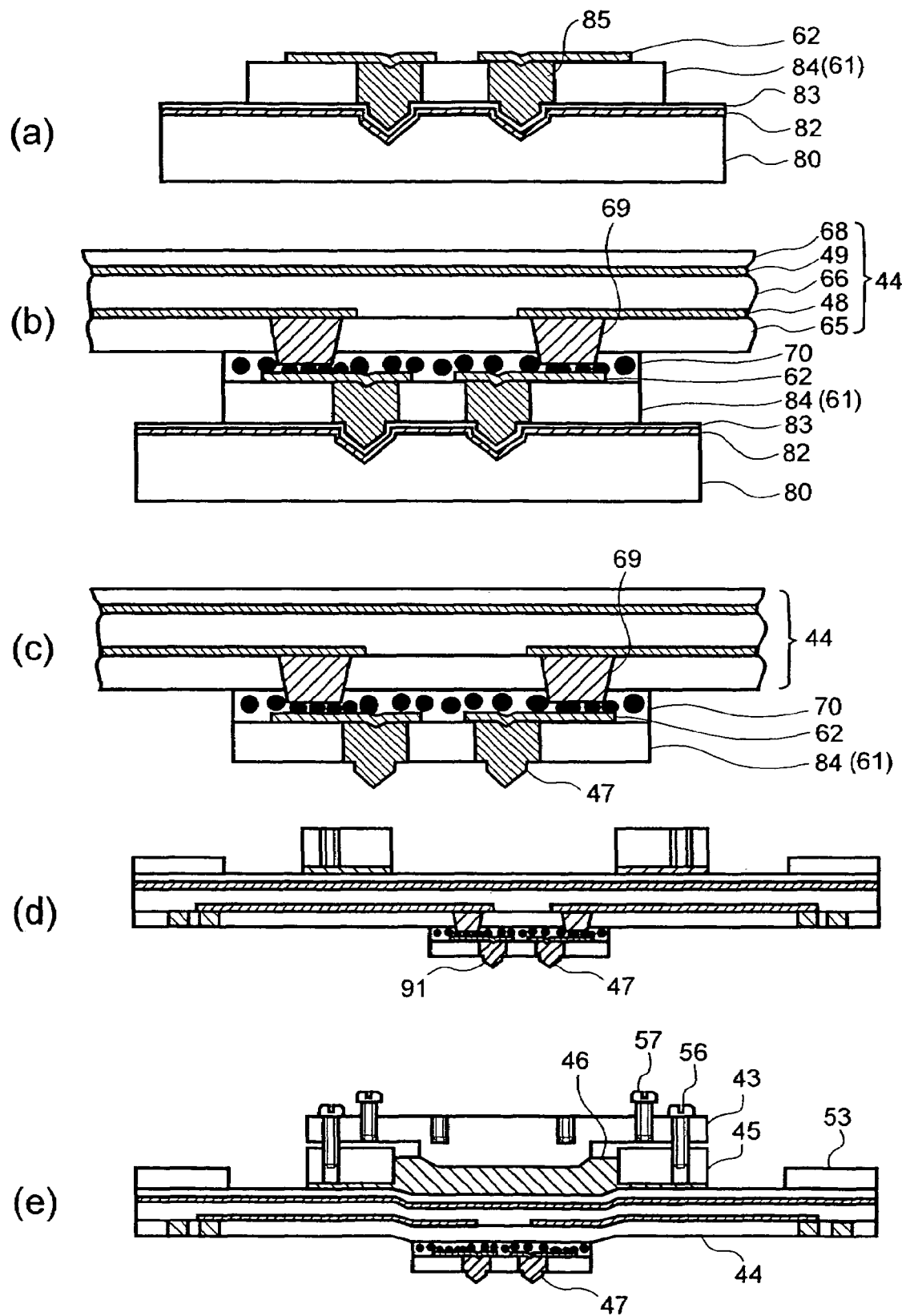
FIGS. 16(a) to 16(e) are a cross sectional views showing steps in the manufacturing process for manufacturing the multilayer film containing the clamping member and frame for the fifth embodiment of the connection device of this invention.

The manufacturing process for forming the connection device (probing device) shown in FIG. 9 is next described while referring to FIG. 16. Processes identical to those in FIG. 14 and FIG. 15 are omitted from the following description.

As shown in FIG. 16(a), a conductive coating 83 is formed on the silicon dioxide film 82 on the surface of the anistropically etched wafer 80 shown previously in FIG. 14(b). Next, after plating the polyimide film 84 (61) in the openings in the surface of the conductive coating 83 and forming the bump 85 for the contact terminals, a copper layer is formed by sputtering or physical vapor deposition methods to create a conductive film of approximately 1 micrometer thickness on the surface of the polyimide film 84 (61) and the bump (85) and the electrodes 62 formed by photoresist masking to form electrodes on that surface.

Next, as shown in FIG. 16(b), the electrode 62 is connected by a conductive anisotropic sheet 70 to the fillet 69 of the multifilm layer 44 previously formed with a lead out wiring 48 to design profile dimensions. This multilayer film 44 may be formed beforehand for instance from a wiring film comprised of a polyimide film 65, a lead out wire 48, an intermediate polyimide film 66, a ground layer 49 and a polyimide protective film 68. When connecting the fillet 69 with the electrode 62, anisolm (Hitachi Chemical Co., Ltd.) may be used as the anisotropic conductive sheet 70 or solder may be utilized for the connection.

Next, as shown in FIG. 16(c), a multilayer film 44 formed of contact terminals 47 is obtained by removing the silicon wafer 80.

As methods for etch removing the silicon wafer 80 formed with contact terminals 47, a method for etching removal of silicon and silicon dioxide or performing selective etch removal of chromium when utilized as the conductive covering 83, may be used to directly peel away the polyimide film 84 formed with contact terminals from the silicon wafer 80 whose surface was oxidized when used as the die for the contact terminals and formed with silicon oxide layer 82. Either of these methods is suitable for use.

In the method for selectively etching removal of the chromium, a solution mixture for instance of aluminum chloride, water of hydration, hydrochloric acid and water may be prepared and etching performed at 50° C. for 4 hours.

Also, as a method for removing the silicon wafer 80 formed with contact terminals 47, rare earth metals such as rhodium or gold may be utilized as the conductive covering 83, and a silicon dioxide film is formed on the surface, and mechanical peeling is then performed at the boundary with the conductive covering 83.

Next, as shown in FIG. 16(d), the frame 45 and the clamping member 53 are position-aligned and bonded on the surface of the protective polyimide film 68 and rhodium plating of the contact terminals 47 is then performed.

Next, as shown in FIG. 16(e), a silicon coating material is next supplied inside the frame 45 as the cushioning layer 46 and is screw-clamped to the clamping member 43 at the frame 45, the gap between the frame 45 and the clamping member 43 narrowed and the slack in the multilayer film 44 itself is eliminated by pressing via the cushioning layer 46 with the clamping member 43 on the area 44a arrayed with the contact terminals 47 in the multilayer film 44, so that a levelness of the tips of the contact terminals 47 can be maintained within a precision of ±2 µm.

An elastomer in a sheet shape may be used as the cushioning layer 46 or the cushioning layer 46 may be omitted.

Next, as shown in FIG. 2, the multilayer film 44 is attached to the circuit board 50, the center pivot 41 is installed to the clamping member 43 and the thin-film probe card is thus completed.

When assembling the connection device (probing device) shown in FIG. 5, after first attaching the center pivot 41 to the clamping member 43, the multilayer film 44 may be installed to the circuit board 50.

In the manufacturing method shown in FIG. 16, a conductive anisotropic sheet 70 was used to achieve electrical continuity between the fillet 69 on the multilayer film 44 and the electrode 62 formed on the bump 85 for the contact terminals however, continuity may also be achieved with solder or a metallic alloy such as Sn—Ag (tin-silver) or Sn—Au (tin-gold).

The manufacturing process shown in FIG. 10 for forming the connection device (probing device) will be described next while referring to FIGS. 17(a) and 17(b). Processes identical to those in FIGS. 14(a)-14(e) and FIGS. 15(a)-15(d) are omitted from the following description.

As shown in FIG. 17(a), a conductive coating 83 is formed on the silicon dioxide film 82 on the surface of the anistropically etched wafer 80 shown previously in FIG. 14(b). Next, after plating the polyimide film 84 in the openings in the surface of the conductive coating 83, the bumps 85 for the contact terminals are formed.

Next, the etching removal method for the polyimide film 84 is carried out as shown in FIG. 17(b).

As shown in FIG. 17(c), the lead out wire 48 is formed beforehand, and the bumps 85 for the contact terminals are connected by way of the conductive anisotropic sheet 70 to the fillet 69 on the wiring film 48 made to design profile dimensions.

Next, in FIG. 17(d), the multilayer film 44 with contact terminals 47 is formed on the wiring film 64 by etch removal of the silicon wafer 80.

As shown next in FIG. 17(e), an identical structure is formed, in a process identical to the process previously described with reference to FIG. 16(e).

A description of the subsequent processes is omitted since these processes are identical to the processes shown previously in FIGS. 16(a)-16(e).

In the manufacturing method shown in FIGS. 17(a)-17(e), a conductive anisotropic sheet 70 was used to achieve electrical continuity between the fillet 69 on the multilayer film 44 and the bump 85 for the contact terminals; however, continuity may of course also be achieved with solder or a metallic alloy such as Sn—Ag (tin-silver) or Sn—Au (tin-gold).

The manufacturing process shown in FIGS. 19(a)-19(b), for forming the connection device (probing device) will be described next while referring to FIGS. 23(a)-23(e). Processes identical to those in FIGS. 14(a)-14(e) and FIGS. 15(a)-15(d) are omitted from the following description.

As shown in FIG. 23(a), a conductive coating 83 is formed on the silicon dioxide film 82 on the surface of the anistropically etched wafer 80 shown previously in FIG. 14(b). Next, after plating the polyimide film 84 in the openings in the surface of the conductive coating 83, the bumps 85 are formed in an integrated piece with the electrodes 200, and gold plating is formed on the electrodes 200.

Next, the etching removal method for the polyimide film 84 is carried our as shown in FIG. 23(b).

As shown in FIG. 23(c), a lead out wiring 48, formed beforehand, and the electrode 200 for the contact terminals are connected by way of solder 201 to the fillet 69 of the multilayer film 44 made to the design outer profile dimensions. The frame 45 is bonded to the multilayer film 44, and next, the silicon coating material is supplied as the cushioning layer 46 into the frame 45.

Next, the process of FIG. 23(d), identical to the process shown in FIG. 14(e) is implemented.

In this process, a silicon wafer 80, with the multilayer film 44 clamped to the frame 45 on the clamping member 43 by means of the screw 56, is mounted via the O-ring 89 between the stainless steel lid 90, in a stainless clamping jig 88, and etching removal is performed for the silicon wafer 80 and the conductive covering 83.

Next, the process shown in FIG. 23(e) is implemented. In this process, the multilayer film 44 screw-clamped to the frame 45 to the clamping member 43 is removed from the lid 90, O-ring 89 and the clamping jig 88. Next, the rhodium plating 91 is applied, the multifilm clamping member 54 is position-aligned and bonded with the periphery of the protective polyimide film 87 for the multilayer film, and the multilayer film 44 is then trimmed to the outer profile design dimensions. The gap between the frame 45 and the clamping member (clamp plate) 43 is next adjusted with the screw 57, and screw tightening of screw 56 makes the tip of the screw 57 come in direct contact with the top edge of the frame 45 so that the clamp member 43 advances with respect to the frame 45, and the pressing action of the clamping member 43 on the area 44a arrayed with the contact terminals 47 on the multilayer film 44, by way of the cushioning layer 46, causes an appropriate stretching in the multilayer film itself so that slack is eliminated in the multilayer film 44 and levelness of the types of the contact terminals can be maintained.

The assembly process is next implemented and the connection device (probing device) comprised of a thin-film probe card is completed.

Figure 23:
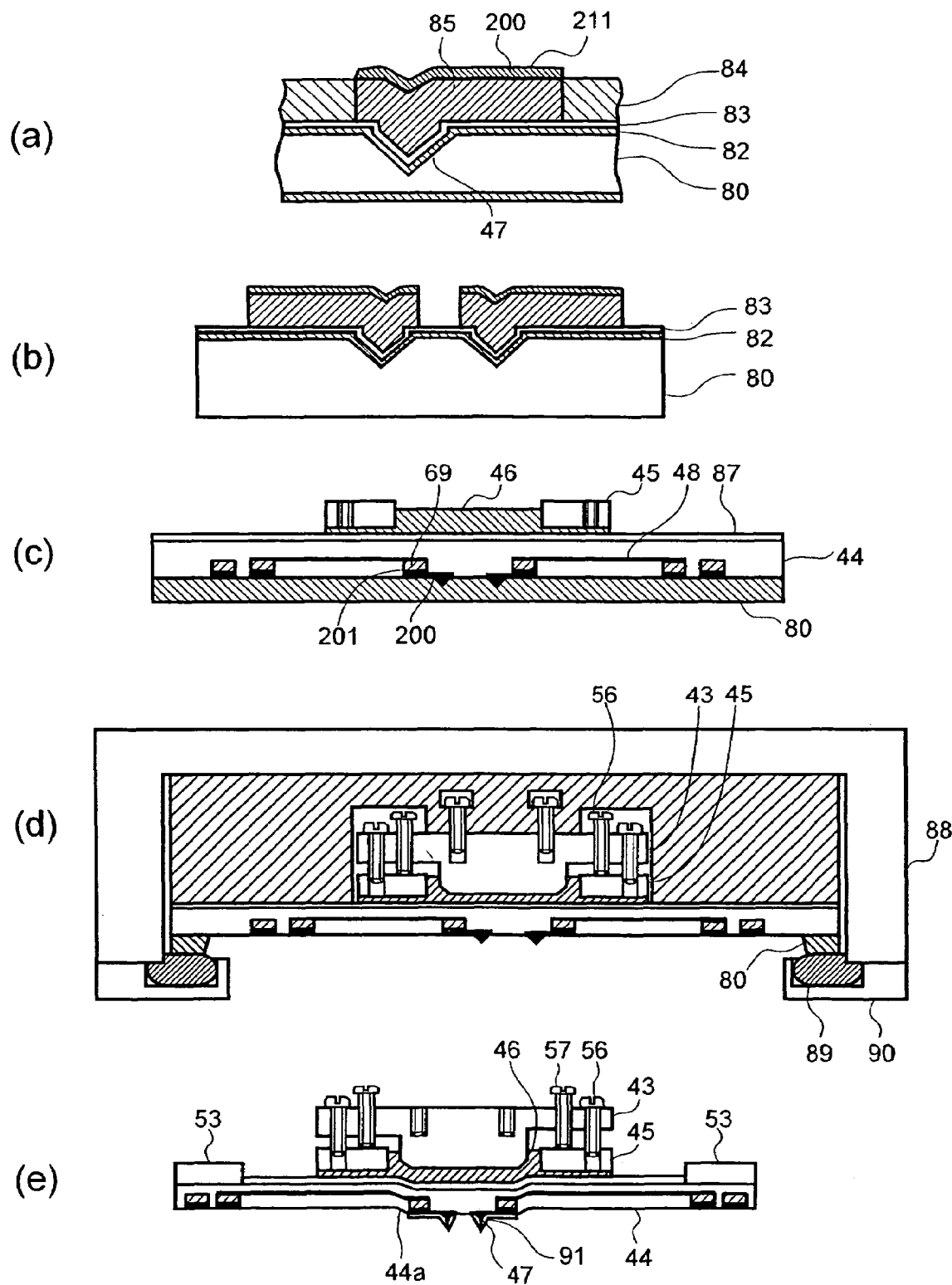
FIGS. 23(a) to 23(e) are cross sectional views showing steps in the manufacturing process for manufacturing the multilayer film containing the clamping member and frame for the fifth through twelfth embodiments of the connection device of this invention.

In the manufacturing method shown in FIG. 23, a solder 201 was used to achieve electrical continuity with the fillet 69 of the multilayer film 44, and the electrode 200 for the contact terminals, however, a solder fillet electrode 203 of FIG. 20(*a*), FIG. 20(*b*) or a metal alloy such as Sn—Au (tin-gold) of FIG. 21(*a*), FIG. 21(*b*) may be used to achieve electrical continuity.

A manufacturing process for removal by etching of the silicon wafer 80 was shown in FIG. 23, however, as was previously related, after connecting the electrode 200 for the contact terminals to the multilayer film 44 with solder or tin/gold alloys as in FIG. 23(*c*), by using chromium as the conductive coating 83 and by selective etching removal using chromium, the surface of the silicon wafer utilized as the die for the contact terminals can be oxidized and needless to say, the contact terminals 47 can be directly peeled away from the silicon wafer 80 formed with a silicon dioxide film 82.

A description of the testing of electrical characteristics of a semiconductor device (chip) under test by utilizing the connection device (probing device) of the above described invention will be described next with reference to FIG. 18.

Figure 18:
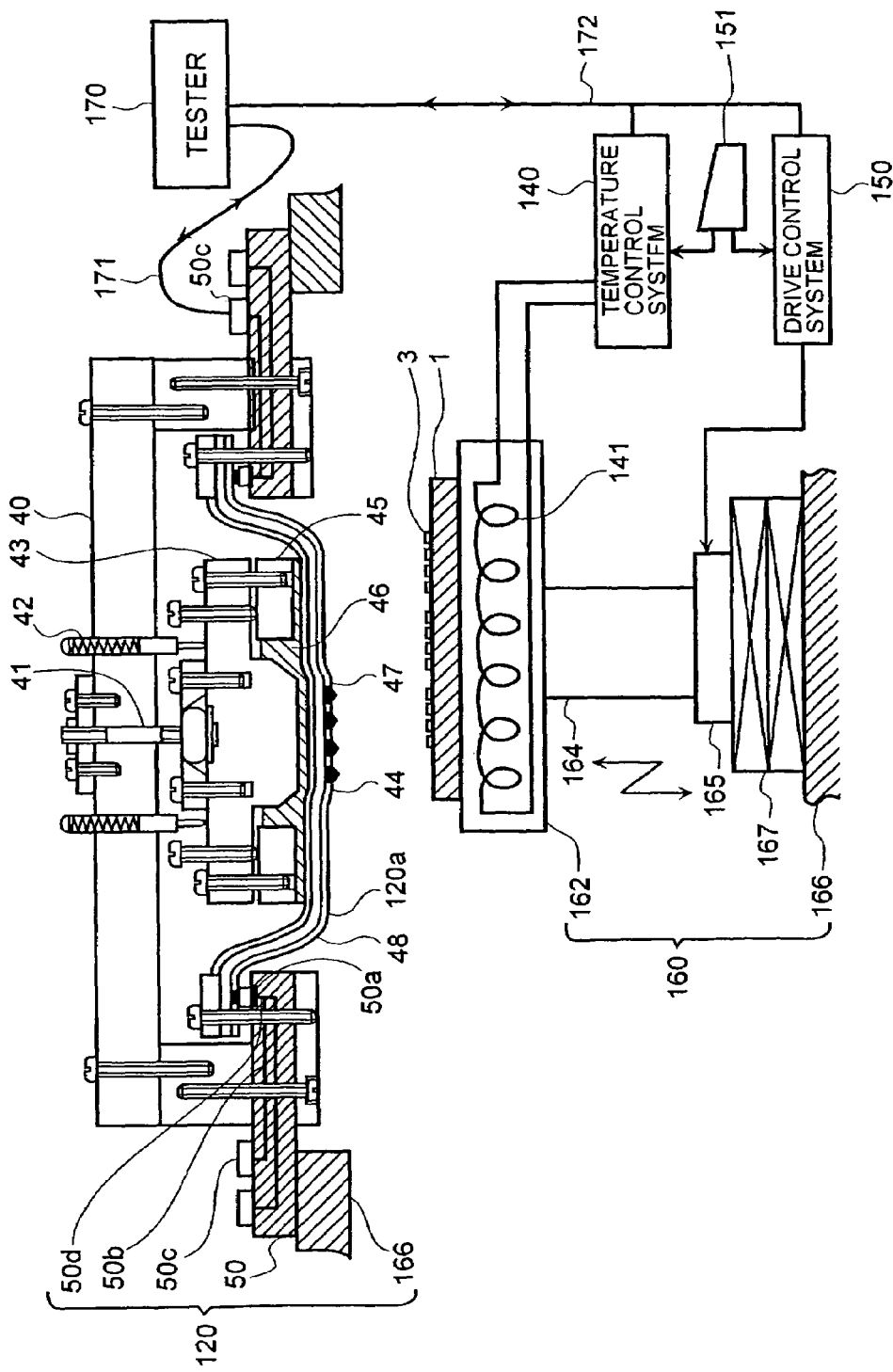
FIG. 18 is a diagram showing an overall concept of the first embodiment of the test system of this invention.

FIG. 18 is an overall concept view showing the first embodiment of the test system of this invention.

This test system is comprised of a wafer prober for manufacture of semiconductor devices. This test system is comprised of a material support system 160 for supporting the semiconductor wafer 1 as the item under test, a probe system 120 for making contact with the electrode 3 of the item under test and for performing an exchange of electrical signals, a drive control system 150 for controlling the operation of the material support system 160, a temperature control system 140 for performing temperature control of the item under test, and a tester 170 for testing electrical characteristics of the semiconductor device (chip) 2. The semiconductor wafer 1 is arrayed with a plurality of semiconductor devices (chip) 2, and on the surface of each of the semiconductor devices (chip) 2, a plurality of electrodes 3 serving as external connection electrodes, are arrayed at a high density and a narrow pitch due to the high integration of semiconductor devices. The material support system 160 has a support block 162 mounted largely horizontally and mounted to allow free installation and removal of the semiconductor wafer 1, a vertical axis 164 mounted perpendicularly to support the support block 162, a vertical drive section 165 to drive the vertical axis 164 up and down, and an X-Y stage 167 to support the vertical drive section 165. The X-Y stage 167 is clamped to the base 166. The vertical drive section 165 is comprised of for instance a stepping motor, etc. The positioning operation for vertical and horizontal directions is performed by combining movement within the horizontal plane of the X-Y stage 167, and the up and down movement of the vertical drive section 165, etc. The support block 162 is installed with a swivel mechanism not shown in the drawing, and the support block 162 is capable of swivel displacement within the horizontal plane.

The probe system 120 is installed above the support block 162. In other words, the connection device 120*a* and the circuit board 50 shown in FIG. 2 or FIG. 5 or FIG. 6 or FIG. 8 or FIG. 9 or FIG. 10 are installed at positions parallel to the support block 162. Inside this connection device 120*a*, a multilayer film 44 having contact terminals 47, a cushioning layer 46, a frame 45, a clamping member (clamp plate) 43, a center pivot 41, a spring probe 42 and a support member (upper clamp plate) 40 are integrated as one unit. Each of the contact terminals 47 are connected to the fillets 50*d* and the electrodes 50*a* of the circuit board 50 by way of the lead out wiring 48 attached to the multilayer film 44 of the connection device 120*a*, and these contact terminals 47 are also connected to the electrodes 50C installed on the circuit board 50 by way of the internal wiring 50*b*. In this embodiment, the contact terminal 50*c* is comprised of a coaxial connector. Connection to the tester 170 is made by way of a cable 171 connected to this contact terminal 50*c*. The connection device utilized here is structured as shown in FIG. 2, however the connection device structure is not limited to the structure of FIG. 2, and needless to say, it may also utilize the structures shown in FIG. 5, FIG. 6, FIG. 8, FIG. 9 or FIG. 10.

The drive control system 150 is connected to the tester 170 by the cable 172. The drive control system 150 sends control signals to each drive actuator of the material support system 160 to control that movement. In other words, the drive control system 150 is provided with a computer internally, which controls the operation of the material support system 160 according to the test operation progress information for the tester 170 sent by way of the cable 172. The drive control system 150 is further provided with an operating section 151, to receive inputs containing all types of instructions relating to drive control such as accepting instructions for manual operation.

A heater 141 is installed in the support block 162 for performing burn-in testing of the semiconductor device 2. A temperature controller 140 regulates the temperature of the semiconductor wafer 1 mounted on the support block 162 by regulating the cooling jig or the heater 141 for the support block 162. A temperature controller system 140 is provided with an operating section 151, to receive inputs containing all types of instructions relating to drive control such as accepting instructions for manual operation.

Next, the operation of the test equipment will be described. The semiconductor wafer 1 as the item under test is placed on the support block 162 and positioned. A plurality of optical image reference marks formed above and separate from the semiconductor wafer 1 (mounted on the support block 162) are captured by imaging equipment such as image sensors or television cameras, and a plurality of position reference marks are detected from the image signals captured from these images. From the position information obtained from the plurality of reference marks above the semiconductor wafer 1, two-dimensional position information is calculated for the overall electrode group based on the array information for semiconductor device 2 arrayed on the semiconductor wafer 1 as well as array information for the electrodes 3 arranged on each semiconductor device 2, obtained from CAD data for models of semiconductor wafer 1 stored in the drive control system 150 or the tester 170. An optical image of designated contact terminal tips from among the plurality of contact terminals 47 formed on the multilayer film 44, or an optical image of a plurality of reference marks formed separately on the multilayer film 44 is captured by imaging equipment (not shown in drawings) such as a television camera or image sensor, and the positions of the designated contact terminals or the plurality of reference marks are detected from the image signals obtained by image capture. The drive control system 150, from position information detected from the plurality of reference marks or designated contact terminals on the multilayer film 44, then calculates the two-dimensional position information for the overall contact terminal group based on probe information such as the array information and height information, according to the probe model stored by an input from the operating section 151. The drive control system 150 then calculates the amount of deviation (offset) for two-dimensional position information for the overall electrode group versus two-dimensional position information calculated for the overall contact terminal group, and drives the X-Y stage 167 and the swivel mechanism, to position the electrode 3 group formed on the plurality of individual semiconductor devices arrayed on the semiconductor wafer 1, directly below the plurality of contact terminals 47 group arrayed on the connection device 120*a*. The drive control system 150 then drives the vertical drive section 165 for instance, based on the gap with the surface of the area 44*a* in the multilayer film 44 measured by means of a gap sensor (not shown in drawing) mounted on the support mount 162, and by raising the support mount 162 up to a pushed up position 8 to 20 μm from the point where the surface 3*a* of the plurality of electrodes (contacted material) 3 are in contact with the tip of the contact terminals, the area 44*a* arrayed with the plurality of contact terminals 47 on the multilayer 44 is made to project and each of the tips of the plurality of contact terminals 47 is maintained at a highly precise degree of levelness as shown in FIG. 3 or in FIG. 7 so that the compliance mechanism, along with making the plurality of contact terminals 47 follow up on and be parallel with the surface 3*a* of the plurality of electrodes 3 arrayed on each target semiconductor device, which makes variations greater than ±2 μm in the height of the individual points of the contact terminals be absorbed by localized warping of the cushioning layer 46, and causes a uniform, low load, contact (about 3 to 50 mN per pin) to be achieved with the electrode (material) 3 arrayed on the semiconductor wafer 1 connected to the contact terminals 47 at a low resistance of 0.01 Ω to 0.1 Ω.

In the drive control system 150, the X-Y stage 167 and swivel mechanism and the vertical drive section 165 are driven and controlled in response to operating instructions from the operating section 151. The support mount 162 in particular, is driven upwards by the vertical drive section 165 to a pushed up state 8 to 100 μm from the point where the surface 3*a* of the plurality of electrodes (contacted material) 3 are in contact with the tip of the contact terminals, and along with the plurality of contact terminals 47 following up on and becoming parallel with the surface 3*a* of the plurality of electrodes 3 arrayed on each target semiconductor device, variations in the height of the individual points of the contact terminals are absorbed by localized warping of the cushioning layer 46, and satisfactory uniform, low load, contact (about 3 to 50 mN per pin) is achieved at a low resistance connection of 0.01Ω to 0.1 Ω between the plurality of contact terminals 47 and each of the electrodes 3.

When performing burn-in tests of the semiconductor device 2 while in this state, temperature regulation of the semiconductor wafer 1 mounted on the support mount 162 is implemented by the heater 141 or cooling jig of the temperature control system 140.

Functions such as the exchange of operation test signals and motor operation between the tester 170 and semiconductor devices formed on the semiconductor wafer 1 are implemented by way of the cable 171, the circuit board 50, the multilayer film 44 and the contact terminals 47 and determinations such as pass-fail checks of operating characteristics of the applicable semiconductor device are performed. In the multilayer film 44 at this time, as shown in FIG. 4, a ground layer 49 is installed to enclose the insulation film 66 (74) for the lead out wiring 48 connected to each of the terminals 47, and by setting the impedance ZO of the lead out wiring 48 to approximately 40Ω and matching with the impedance of the tester circuit, distortion and attenuation of the electrical signals transmitted through the lead out wiring 48 can be prevented, and high frequency electrical signals (high frequencies from about 100 MHz up to some 10 GHz) can be utilized with the tester on the semiconductor device under test to measure device electrical characteristics.

Still further, the series of test operations described above can be implemented on each of the plurality of semiconductor devices formed on the semiconductor wafer 1 and determinations such as pass-fail checks of semiconductor device operating characteristics can be made.

This invention as described above, provides the effect that stable, low load probing of many pins at a narrow pitch on a semiconductor device with a high electrode density can be performed without damage to the device under test and furthermore a high speed exchange of electrical signals or in other words high frequency electrical signals (high frequencies from about 100 MHz up to some 10 GHz) can be achieved.

This invention provides the further effect that the compliance mechanism achieves a parallel array of pointed contact terminals without slack in the applicable area of the multilayer film so the pointed contact terminal group makes stable contact with the electrode group of the device under test, with only a downward pressure applying a low load on each pin (approximately 3 to 50 mN) to achieve a stable connection with a low resistance of about 0.05 to 0.1 Ω and without generating debris from the electrode material, etc. This invention provides a yet further effect that, one or a plurality of semiconductor devices from among a plurality of semiconductor devices (chips) arrayed on a wafer can simultaneously be stably and reliably contacted at a small contact pressure (about 3 to 50 mN per pin) on the oxidized surface of the electrodes, formed for instance of aluminum or solder with a stable and low resistance value of 0.05 to 0.1 Ω, and operational tests of each semiconductor device can be performed by the tester. In other words, the above structure of this invention is compatible with devices having a high electrode density as well as narrow pitch, and further it can perform testing by simultaneous probing of many discrete chips and can also perform operational tests with high speed electrical signals (high frequencies from about 100 MHz up to some 10 GHz). This invention provides still another effect in being capable of performing device operating tests at high temperatures, such as burn-in tests, by utilizing material resistant to high temperatures such as polyimide film (insulator film).

This invention provides yet another effect in that a plurality of contact terminals with pointed tips can be easily arrayed on the multilayer film by connecting the contact terminals with pointed tips to the lead out wiring by means of conductive anisotropic sheets or metallic joints.

also perform operational tests with high speed electrical signals (high frequencies from about 100 MHz up to some 10 GHz). This invention provides still another effect in being capable of performing device operating tests at high temperatures, such as burn-in tests, by utilizing material resistant to high temperatures such as polyimide film (insulator film).

This invention provides yet another effect in that a plurality of contact terminals with pointed tips can be easily arrayed on the multilayer film by connecting the contact terminals with pointed tips to the lead out wiring by means of conductive anisotropic sheets or metallic joints.

What is claimed is:

1. A method of producing a semiconductor device comprising the steps of:
   forming a plurality of semiconductor devices on a wafer;
   contacting a plurality of contact terminals to electrodes of said semiconductor devices and testing electrical characteristics of said semiconductor devices; and
   detaching said semiconductor devices from said wafer,
   wherein said step of testing electrical characteristics of said semiconductor devices includes a step of exchanging an electrical signal between said semiconductor devices and a tester circuit through said contact terminals and wires,
   wherein the contact terminals are formed by using a wafer with an etched hole as a mold and are made of conductive materials.
   wherein said wires and said contact terminals are formed separately and both are electrically connected to form a multilayer film,
   wherein said multilayer film has an insulation layer,
   wherein said wires are formed on said insulation layer, and
   wherein a ground layer is formed on a reverse side of said wires formed on said insulation layer.

2. A method of producing a semiconductor device according to claim 1,
   wherein said wires are installed between said ground layer and said contact terminals.

3. A method of producing a semiconductor device according to claim 1,
   wherein said wires and said contact terminals are electrically connected by a conductive anisotropic sheet or solder or heat expansion of metal.

4. A method of producing a semiconductor device according to claim 1, wherein said semiconductor devices are tested in one batch.

5. A method of producing a semiconductor device according to claim 1,
   wherein said wires set an impedance by using said ground layer before being electrically connected to said contact terminals.

6. A method for producing a semiconductor device according to claim 5,
   wherein said wires set an impedance for matching with said tester circuit.

7. A method for producing a semiconductor device according to claim 6,
   wherein said semiconductor device is tested by exchanging high frequency electrical signals higher than 100 MHz through said wires in which impedance is matched with said tester circuit, and
   wherein said contact terminals have a length equal to or less than 0.5 mm and equal to or more than 0.05 mm.

8. A method for producing a semiconductor device according to claim 1,
   wherein said etched hole of said wafer is formed by anisotropic etching.

* * * * *